(12) United States Patent
Pele et al.

(10) Patent No.: US 10,802,908 B2
(45) Date of Patent: Oct. 13, 2020

(54) DATA DEPENDENT ALLOCATION OF ERROR CORRECTION RESOURCES

(71) Applicant: Western Digital Technologies, Inc., San Jose, CA (US)

(72) Inventors: Ofir Pele, Jerusalem (IL); Ariel Navon, Revava (IL); Alex Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 185 days.

(21) Appl. No.: 16/051,416

(22) Filed: Jul. 31, 2018

(65) Prior Publication Data

US 2020/0042378 A1    Feb. 6, 2020

(51) Int. Cl.
*G06F 11/10* (2006.01)
*G06F 11/07* (2006.01)
*H03M 13/11* (2006.01)

(52) U.S. Cl.
CPC .......... *G06F 11/10* (2013.01); *G06F 11/0781* (2013.01); *H03M 13/1114* (2013.01); *H03M 13/1125* (2013.01)

(58) Field of Classification Search
CPC .. G06F 11/10; G06F 11/1048; G06F 11/0781; H03M 13/1125; H03M 13/1114
See application file for complete search history.

(56) References Cited

U.S. PATENT DOCUMENTS

| 6,961,890 | B2 | 11/2005 | Smith |
| 7,730,344 | B1 | 6/2010 | Perozo |
| 8,856,439 | B2 | 10/2014 | Weber et al. |
| 8,898,548 | B1* | 11/2014 | Mullendore ........ H03M 13/353 365/185.09 |
| 9,112,537 | B2 | 8/2015 | Ramirez et al. |
| 9,690,656 | B2 | 6/2017 | Strauss et al. |

(Continued)

FOREIGN PATENT DOCUMENTS

| EP | 3128427 A1 | 2/2017 |
| WO | 2005057412 A1 | 6/2005 |

(Continued)

OTHER PUBLICATIONS

C. Diaz, J. Cabrera, F. Jaureguizar and N. Garcia, "A video-aware FEC-based unequal loss protection system for video streaming over RTP," in IEEE Transactions on Consumer Electronics, vol. 57, No. 2, pp. 523-531, May 2011. (Year: 2011).*

(Continued)

*Primary Examiner* — Cynthia Britt

(74) *Attorney, Agent, or Firm* — Barry IP Law, P.C.

(57) ABSTRACT

Various method and apparatus embodiments for data dependent error correction code (ECC) encoding are disclosed. In one embodiment, a data object may include multiple portions, with each portion having different characteristics. An ECC encoder may allocate error correction resources (e.g., parity bits) to the different portions at respectively different data rates (e.g., more error correction resources to some portions relative to other portions). Upon completion of the allocation, the data object and the associated error correction resources are forwarded to a storage medium for storage therein.

26 Claims, 19 Drawing Sheets

(56) References Cited

U.S. PATENT DOCUMENTS

| | | | |
|---|---|---|---|
| 9,786,386 B2 | 10/2017 | Strauss et al. | |
| 9,916,199 B2* | 3/2018 | Azogui | G06F 3/0619 |
| 9,952,939 B1 | 4/2018 | Sun et al. | |
| 10,275,309 B2 | 4/2019 | Yamamoto | |
| 2008/0195900 A1* | 8/2008 | Chang | G06F 11/1068 |
| | | | 714/718 |
| 2010/0211851 A1* | 8/2010 | Dixon | G06F 11/108 |
| | | | 714/763 |
| 2010/0251036 A1 | 9/2010 | Moyer | |
| 2010/0251068 A1 | 9/2010 | Lin et al. | |
| 2011/0047437 A1 | 2/2011 | Flynn | |
| 2011/0116491 A1* | 5/2011 | Kovacs | H04N 21/234327 |
| | | | 370/345 |
| 2011/0191654 A1 | 8/2011 | Rub | |
| 2012/0124448 A1 | 5/2012 | Emerson et al. | |
| 2013/0145238 A1* | 6/2013 | Alhussien | H03M 13/23 |
| | | | 714/786 |
| 2013/0159813 A1* | 6/2013 | Radke | G06F 11/1068 |
| | | | 714/763 |
| 2014/0006898 A1 | 1/2014 | Sharon et al. | |
| 2014/0019823 A1* | 1/2014 | Ramirez | G06F 11/1064 |
| | | | 714/755 |
| 2014/0143523 A1 | 5/2014 | Chadha et al. | |
| 2015/0074487 A1* | 3/2015 | Patapoutian | G06F 11/1012 |
| | | | 714/758 |
| 2015/0100854 A1 | 4/2015 | Lu | |
| 2016/0110252 A1* | 4/2016 | Hyun | G11C 29/52 |
| | | | 714/766 |
| 2016/0132388 A1* | 5/2016 | Kim | G06F 3/0619 |
| | | | 714/764 |
| 2017/0039104 A1* | 2/2017 | Kapoor | G06F 11/1068 |
| 2017/0249242 A1 | 8/2017 | Thatcher et al. | |
| 2018/0024877 A1* | 1/2018 | Gold | G06F 3/065 |
| | | | 714/773 |
| 2018/0029331 A1* | 2/2018 | Bortell | B32B 7/12 |
| 2018/0069658 A1 | 3/2018 | Benisty et al. | |
| 2020/0007169 A1 | 1/2020 | Lamberts et al. | |

FOREIGN PATENT DOCUMENTS

| | | |
|---|---|---|
| WO | 2009126641 A9 | 12/2009 |
| WO | 2016048634 A1 | 3/2016 |

OTHER PUBLICATIONS

J. Li, K. Zhao, J. Ma and T. Zhang, "Realizing Unequal Error Correction for nand Flash Memory at Minimal Read Latency Overhead," in IEEE Transactions on Circuits and Systems II: Express Briefs, vol. 61, No. 5, pp. 354-358, May 2014. (Year: 2014).*

Cassuto, Yuval, Coding Techniques for Data-Storage Systems, 2008, 180 pages, California Institute of Technology, USA.

Ghosh, Shalini, et al., Dynamic Low-Density Parity Check Codes for Fault-tolerant Nanoscale Memory, Jan. 2007, 5 pages, Computer Science Laboratory, SRI International, Menlo Park, CA.

Ghosh, Shalini, et al., Low-Density Parity Check Codes for Error Correction in Nanoscale Memory, Sep. 25, 2007, pp. 1-22, SRI International, Menlo Park, CA.

Hardesty, Larry, New frontier in error-correcting codes, MIT News Office, Oct. 2, 2014, 3 pages, MIT.

Kim, Jangwoo, et al., Multi-bit Error Tolerant Caches Using Two-Dimensional Error Coding, Proceedings of the 40th Annual ACM/IEEE International Symposium on Microarchitecture, Dec. 1-5, 2007, 13 pages.

Pending U.S. Appl. No. 16/020,853, filed Jun. 27, 2018, entitled "System-Level Error Correction Coding Allocation Based on Device Population Data Integrity Sharing", Bernd Lamberts et al.

Puttarak, Nattakan, Coding for storage: disk arrays, flash memory, and distributed storage networks, Lehigh Preserve, 2011, 180, Theses and Dissertations, Paper 1144, Lehigh University, USA.

Extended European Search Report dated Oct. 29, 2019, from counterpart European Application No. 19179780.2, 12 pages.

* cited by examiner

Layers Become Progressively Finer Proceeding Inward

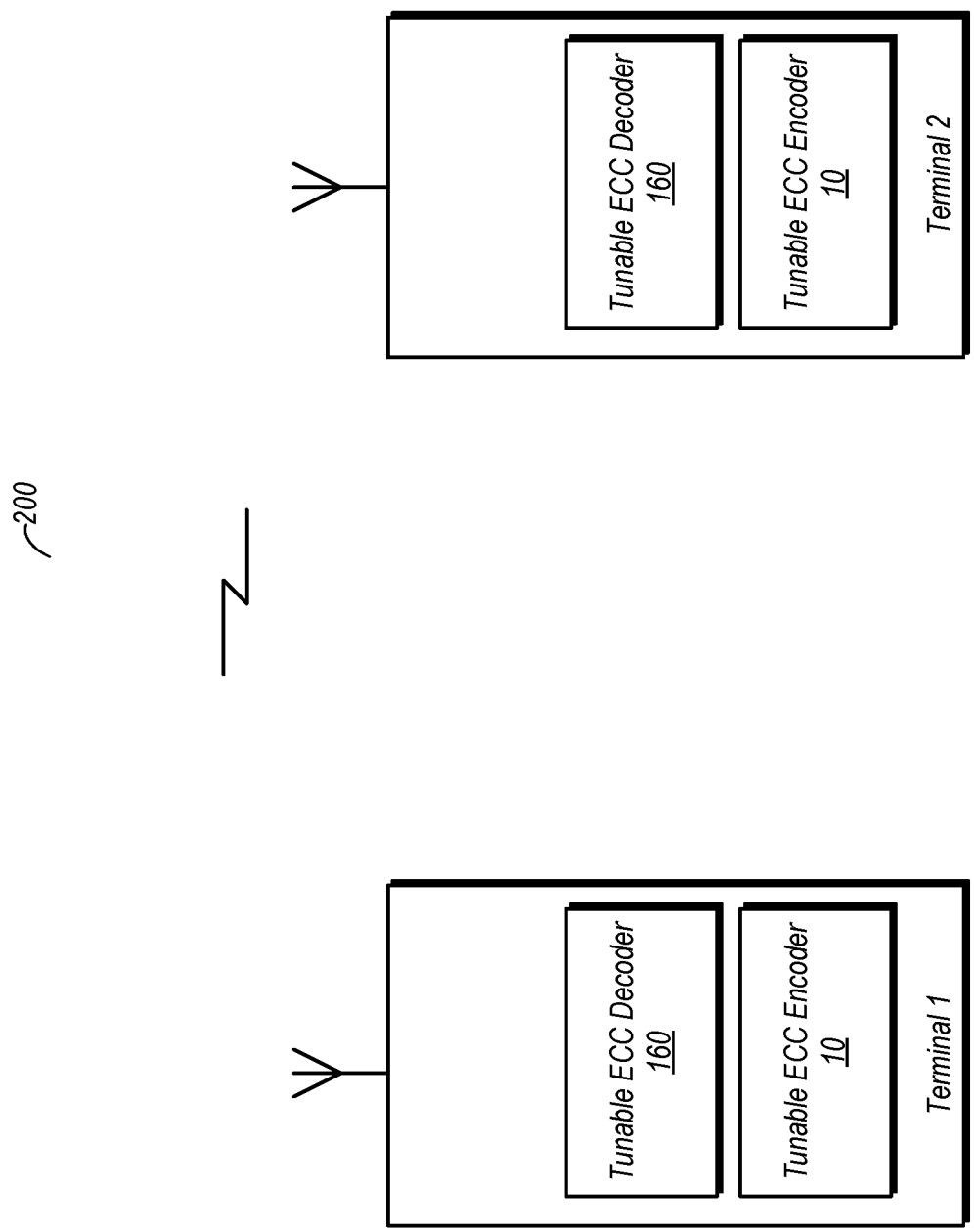

DATA DEPENDENT ALLOCATION OF ERROR CORRECTION RESOURCES

BACKGROUND

Technical Field

This disclosure is directed to error correction mechanisms, and more particularly, the allocation of error correction information.

Description of the Related Art

Storing and transmitting data, while relatively reliable, is nevertheless at times susceptible to errors. Errors in data may manifest themselves in one or more bits having values opposite than what is intended (e.g., a logic one instead of an intended logic zero). If left uncorrected, these errors can render the data in which they are contained to be unusable or significantly degraded. For example, one or more uncorrected errors in an image file can, at minimum, alter the appearance of the corresponding image if not otherwise rendering the file unusable. In order to counter the effects of errors in data, many computer and storage systems utilize error detection and correction mechanisms. Such mechanisms may be used to detect the presence of errors, and if possible correct the errors.

One common method of error detection is to assign parity bits (also known as check bits) to a string of binary data to ensure that, for example, the number of logic ones is even (for even parity) or odd (for odd parity). Each parity bit may be assigned to a particular block of data. For example, one parity bit may be included in every eight bits of data in one implementation. Error detection circuitry may, upon receiving a block of data, read the parity bit and count the number of logic ones to determine if the number is correct. If the number of logic ones is incorrect, indicating the presence of an error, error correction circuitry may locate the incorrect bit, with a subsequent correction being applied to the block of data.

SUMMARY

Various method and apparatus embodiments for data dependent allocation of error correction resources. In one embodiment, a data object may include multiple portions, with each portion having different characteristics. An ECC encoder may allocate error correction resources (e.g., parity bits) to the different portions at respectively different data rates (e.g., more error correction resources to some portions relative to other portions). Upon completion of the allocation, the data object and the associated error correction resources are forwarded to a storage medium for storage therein.

In one embodiment, a tunable encoder may receive a data object and determine its format. The tunable encoder may further determine characteristics of different portions of the data object, and allocate error correction resources accordingly. The allocation of error correction resources among the different portions of the data object may be varied based on, e.g., relative importance of each portion, sensitivity to data corruption, and so on. A tunable decoder to check for errors in the data object (e.g., upon reading from a storage medium) based on the prior allocation of error correction resources is also contemplated.

By varying the amount of error correction resources allocated to different portions of a data object, a more robust scheme for protecting data may be realized. Portions of a data object that are more sensitive to corruption may receive more error correction resources, thereby providing extra protection. Conversely, portions of a data object that are less sensitive to corruption may receive fewer error correction resources. Thus, in contrast to error correction schemes in which the error correction resources are evenly allocated across a data object, varying the level of protection within a data object may achieve a more efficient allocation of error correction resources while also enhancing the overall level of protection for the same.

BRIEF DESCRIPTION OF THE DRAWINGS

The following detailed description makes reference to the accompanying drawings, which are now briefly described.

FIG. 20 is a block diagram of one embodiment of an example communications system.

Figure 1:
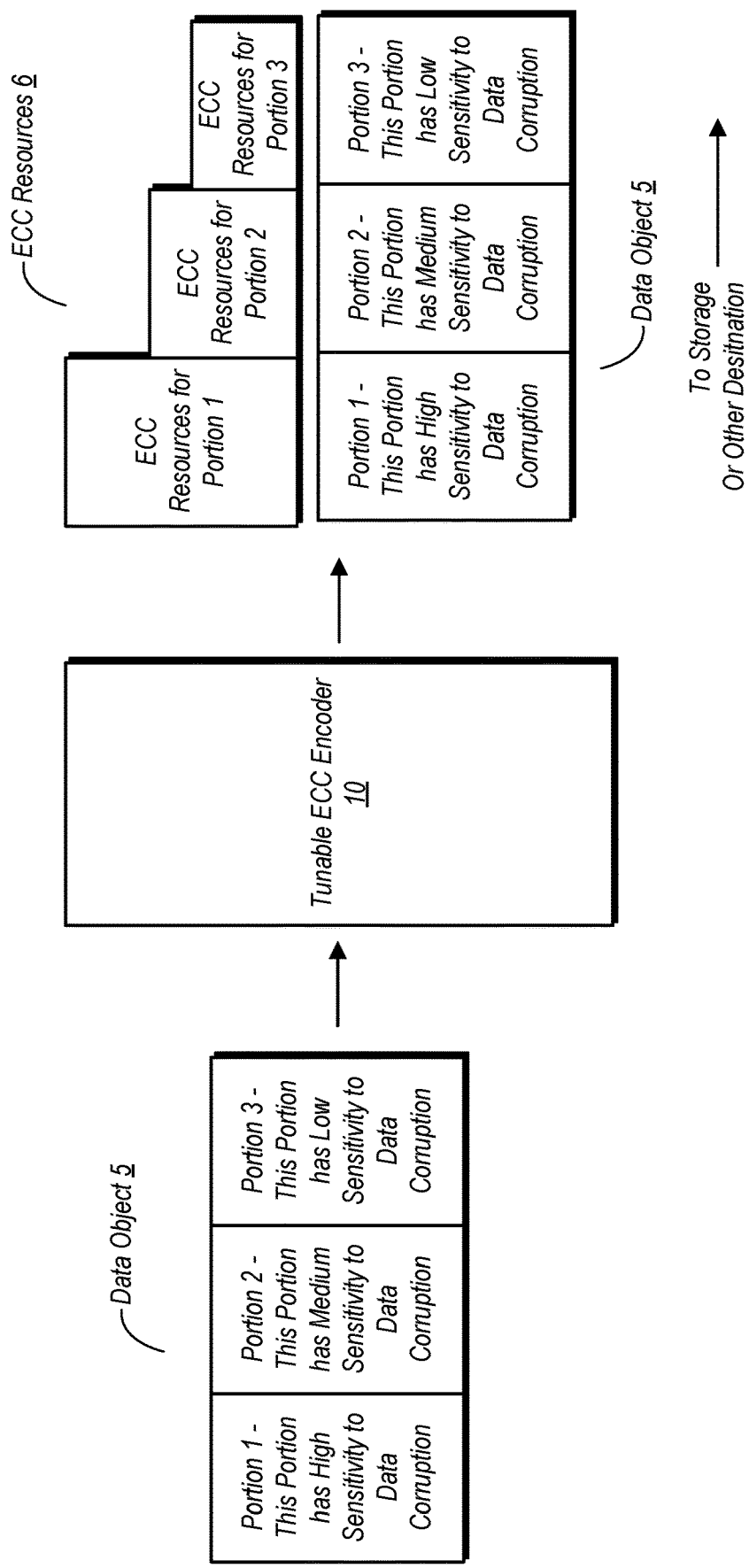
FIG. 1 is a block diagram illustrating data-dependent ECC encoding according to one embodiment of the disclosure.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Overview:

The present disclosure is directed to various method and apparatus embodiments for performing data-dependent allocation of error correction resources to a data object, as well as the corresponding error detection and correction based on the aforementioned allocation. This is based on the recognition that different portions of a given data object may be more or less sensitive to corruption. These different portions may be of different data types and/or different locations within that data object. Based on factors such as this, more error correction resources may be allocated to certain portions of a data object while fewer are allocated to others.

By allocating more error correction resources to certain portions of a data object, the likelihood of critical (or fatal) errors may be reduced relative to error correction schemes in which the error correction resources are applied evenly across all portions and data types within a data object. Similarly, fewer error correction resources may be allocated to portions of a data object that are less susceptible to corruption and/or for which an uncorrectable error is less likely to render the data object unusable. Accordingly, the various embodiments discussed herein may achieve a more efficient allocation of error correction resources by allocating more to those portions where it would likely be more beneficial. Furthermore, the overall level of data protection may be enhanced, since those portions of a data object where errors are more costly and/or more likely receive additional protection with respect to those portions where errors are less likely to occur, less costly, or both.

Apparatus and Method Embodiments for
Data-Dependent Allocation of Error Correction
Resources FIG. 1 is a block diagram is a block diagram illustrating data-dependent allocation of error correction resources. In the embodiment shown, a tunable ECC encoder 10 is configured to generate ECC resources (e.g., parity bits, in accordance with an error correction code) 6 for data object 5. After output from tunable ECC encoder 10, the data object, along with its allocated ECC resources 6, may be conveyed to a storage medium or some other destination.

Data object 5 may be a data file or any other type of structured data. Non-limiting examples of data objects may include image files, video files, audio files, structured data objects within object storage, and so on. As shown in the drawing, data object 5 is subdivided into multiple portions, three in this particular case. The number of portions in a data object may vary from one embodiment to the next. The different portions of data object 5 may be distinguished from the others in various ways. For example, the different portions may be of different data types within data object 5. In another example, the different portions may be different regions of a data file. The different portions of data object may vary from one another in terms of sensitivity to data corruption and/or importance within the file. Accordingly, tunable ECC encoder 10 may vary the amount of ECC resources allocated to each portion based on such differences. This is shown in the drawing as ECC resources 6, where more error correction resources are allocated to Portion 1 of data object 5, with fewer resources allocated to Portion 2, and even fewer resources allocated to Portion 3. Data object 5 may also include data in transmission, such as streams of data, data packets used in various bus communication protocols, data packets used in various network communication protocols, etc.

As used herein, sensitivity to data corruption is defined as the impact that corruption of a portion of a data object has on the usability of the data object. For example, a first portion of a data object has a higher sensitivity to data corruption than a second portion if corruption of the first portion detectably impairs the use of the data object to a greater degree than corruption of the second portion. Examples of impaired use may include, but are not limited to, fatal errors (e.g., corruption of the first portion renders the data object unusable, whereas corruption of the second portion does not), or distortion of audio or visual data (e.g., corruption of the first portion causes detectably greater distortion of audio or visual characteristics than corruption of the second portion).

To provide one example of a file having multiple portions, consider a music audio file (such as an .mp3 file in conjunction with a metadata container format, such as ID3). In addition to the data that corresponds to the actual music, the file may also contain additional information including, but not limited to, song lyrics, album artwork, information associated with the song such as artist, composer, year of release, genre, and so on. Corruption of the main audio portion of the file can render it unplayable. In contrast, corruption of portions of the file containing album artwork, lyrics, and so on, do not necessarily render the file unplayable, and may have minimal, if any affect. Accordingly, per this example, an embodiment of tunable ECC encoder 10 may allocate more error correction resources to the audio portion of the file than, e.g., to the album artwork or lyrics portion of the file. Other examples may include compressed data, encoded data (e.g., data encoded under a MPEG based standard), data protected by certain security mechanisms, etc.

Figure 2:
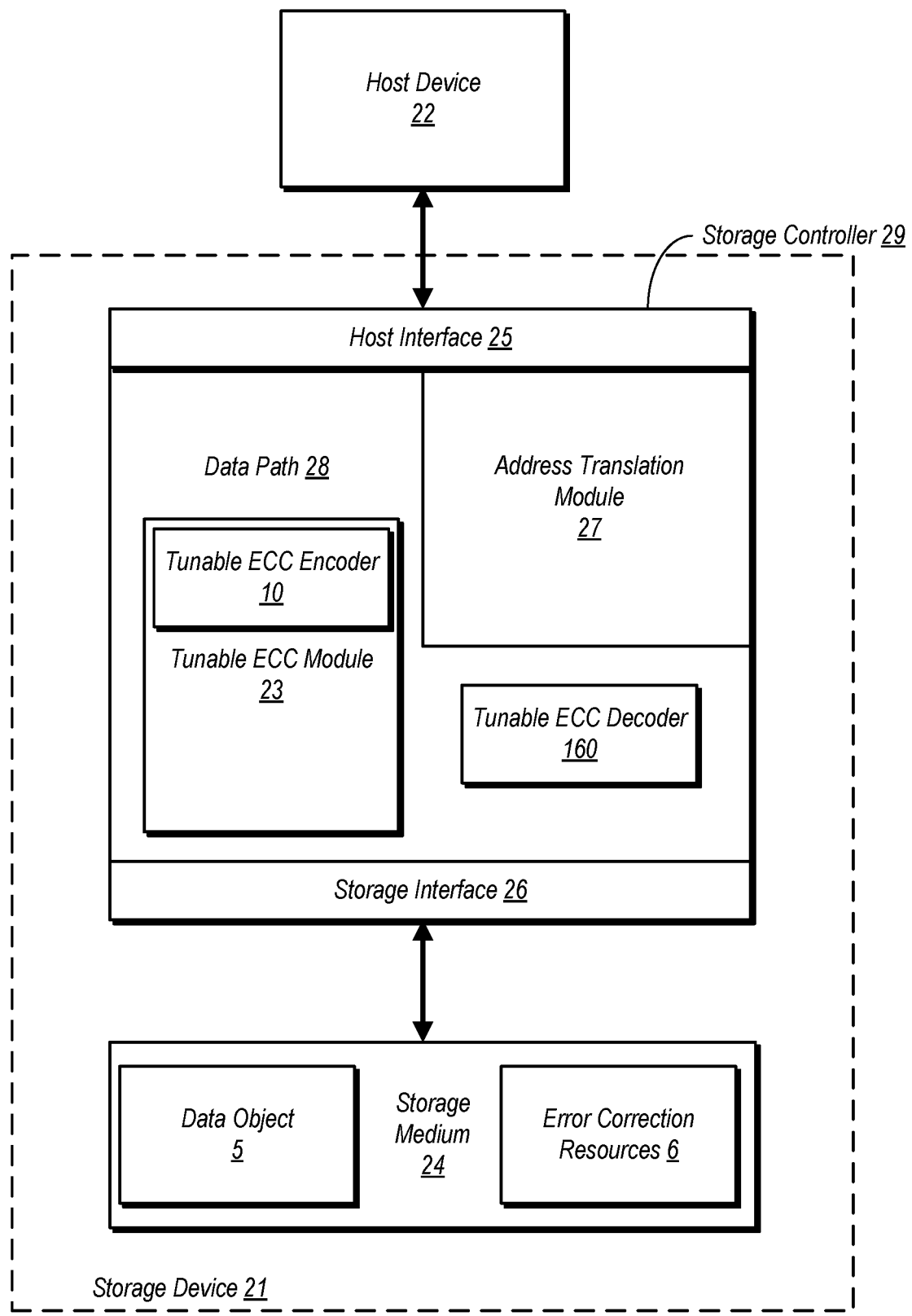
FIG. 2 is a block diagram of one embodiment of a storage system having a storage controller.

FIG. 2 is a block diagram of one embodiment of a storage system having a storage controller. It is noted that in the embodiment shown, storage controller 29 is implemented within a larger storage device 21 (e.g., such as a flash storage system or disk storage system). However, this depiction is not intended to be limiting, as storage controller 29 may be implemented separate from such a system. Accordingly, the disclosure contemplates both a data storage device including the storage controller as shown here, as well as a storage controller separate from the storage device. The operation of the storage controller may conform to any of the various method and apparatus embodiments of the same as discussed below. It is noted that while the various embodiments of data dependent allocation of error correction resources are discussed herein as being performed in a storage controller, use of the same in other contexts is possible and contemplated. These contexts include communications systems (e.g., as discussed below in reference to FIG. 20), as well as in a memory controller coupled to a main system memory (e.g., random access memory) in various types of computer systems.

In the embodiment shown, storage controller 29 is coupled to a storage medium 24 within storage device 21. Storage medium 24 may be any type of persistent, non-transitory storage including, but not limited to, magnetic storage, disk storage, tape storage, various solid state storage (e.g., flash), optical storage, etc. For brevity, such persistent, non-transitory storage will be described in the example embodiments throughout, but it is contemplated that these storage examples can be replaced by, and/or combined with, various types of memory mediums such as Dynamic Random Access Memory (DRAM), solid state memory (e.g., NOR or NAND flash memory), Magneto-Resistive RAM (MRAM), resistive RAM, Phase Change Memory (PCM) and other type of memory technology. Thus, it is contemplated that the term "storage", as used herein, may encompass any type of storage and memory medium. In memory applications, as mentioned above, a memory controller may be used in place of a storage controller, but the memory controller may be configured according to the description for the various embodiments. An example of a storage medium illustrating how can be stored therein is discussed below in reference to FIG. 6.

Storage device 21 is coupled to host device 22 in the embodiment shown, via a host interface 25 of storage controller 29. Host device 22 may be virtually any type of device which may generate data for storage and which may need access to stored data. Examples of host device 22 include a computer system, processors (or processor cores of a multi-core processor) and so on.

Storage controller 29 may be an integrated circuit, or portion thereof (e.g., a unit of circuitry implemented on a system-on-a-chip), that includes circuitry for performing various storage related functions such as reading data from a storage medium, writing data to a storage medium, determining where within a storage medium data is to be stored, as well as performing the various functions related to allocation of error correction resources and error detection/correction using the same. Storage controller 29 in the embodiment includes a host interface 25 that implements circuitry used in communications with host device 22, and a storage or memory interface 26 that implements circuitry used in communications with storage or memory medium 24. Between these two interfaces is circuitry implementing data path 28, which is shown here in simplified form. In addition to the circuitry implementing tunable ECC module 23 and tunable ECC decoder 160, data path 28 may also include other types of circuitry, such as buffers, drivers and/or receivers, and any other circuitry used in the movement of data between storage medium 24 and host device 22. Storage controller 29 also includes an address translation module 27, which includes circuitry to translate addresses between the virtual and physical domains.

Tunable ECC module 23 in the embodiment shown implements circuitry including tunable ECC encoder 10. Additional circuitry within tunable ECC module 23 is discussed below. Tunable ECC encoder 10 may perform data-dependent allocation of error correction resources (e.g., parity bits) to data objects that are to be stored in storage medium 24. Information output from tunable ECC encoder 10 (including both the data object and the ECC resources allocated to each portion thereof) may be conveyed through storage or memory interface 26, to storage or memory medium 24. Storage or memory medium 24, as shown in FIG. 2, may store both data object 5 and error correction resources 6, although not necessarily in the same portions thereof. Circuitry within data path 28 may determine where in storage medium 24 specific pieces of information are to be stored.

Tunable ECC decoder 160 in the embodiment shown includes circuitry that performs functions including error detection and correction of information read from storage medium 24. During a read operation, both the data object to be read and its associated error correction resources are conveyed to tunable ECC decoder 160. Based on the allocation of error correction resources performed by tunable ECC decoder 10, tunable ECC decoder 160 may check for errors within the data object as read from storage medium 24. Furthermore, for correctable errors, ECC decoder 160 may also perform error correction for any errors found. The determination of the presence of errors may include both hard bit decoding and soft bit decoding. Hard bit decoding as defined herein may include a basic determination on the value of the information read from storage medium 24, e.g., whether or not a bit is a logic 1 or a logic 0. Soft bit decoding as defined herein includes determining the reliability of information that has been hard bit decoded. For example, soft bit decoding may determine the reliability of an individual bit based on a threshold voltage used to distinguish between a logic 1 and a logic 0, as well as the delta between an actual voltage of the bit and the threshold voltage. Decoding performed by tunable ECC decoder 160 is discussed in further detail below.

It is noted that storage controller 29, in its various embodiments and equivalents thereto, is an example of a means for allocating error correction information to first and second portions of a data object, where an amount of error correction information allocated per unit of data to the first portion is different from an amount of error correction information allocated per unit of data to the second portion, where data of the first and second portions have different characteristics with respect to one another, and where the first portion of the data object has a higher sensitivity to data corruption than the second portion.

Additionally, it is noted that storage medium 24, in its various embodiments and equivalents thereto, is an example of a means for storing a data object having first and second portions, along with error correction information allocated to the first and second portions.

Figure 3:
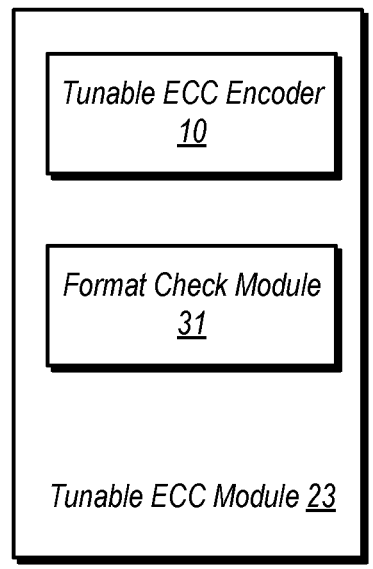
FIG. 3 is a block diagram of one embodiment of a tunable ECC module.

FIG. 3 is a block diagram of one embodiment of a tunable ECC module. In the embodiment shown, tunable ECC module 23 includes circuitry implementing both a tunable ECC encoder 10 and a format check module 31. Upon receiving a data object for encoding/error resource allocation, format check module 31 determines its format, and may also determine various characteristics thereof. These characteristics may include, but are not limited to, the presence of code tables, the arrangement of data in a progressive format, and examples given below in the discussion of FIG. 4. Based on the determined format and determined characteristics of the data object, tunable ECC encoder 10 may then allocate error correction resources to the data object that can be later used to determine the presence or absence of errors. The allocation of error correction resources by tunable ECC encoder 10 may vary for different portions of the data object based on, e.g., sensitivity to corruption, importance, and/or other considerations. After the allocation by tunable ECC encoder is complete, the error correction resources and the data object may be forwarded for, e.g., storage in a storage medium.

Figure 4:
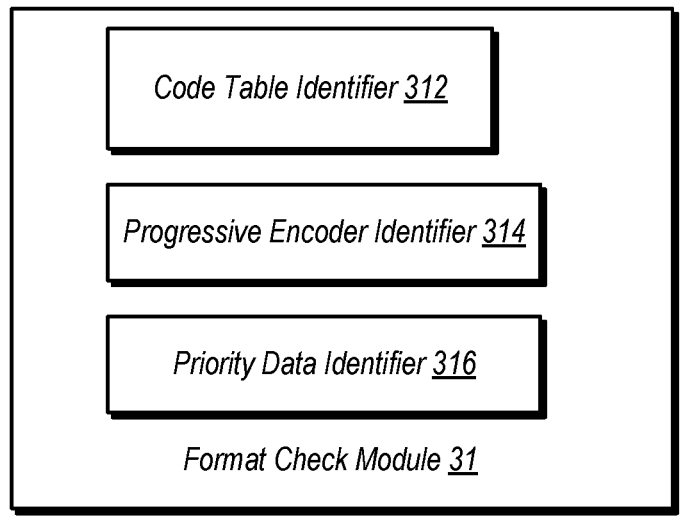
FIG. 4 is a block diagram of one embodiment of a format check module.

FIG. 4 is a block diagram of one embodiment of a format check module. In the embodiment shown, format check module 31 includes circuitry implementing a code table identifier 312, a progressive encoder identifier 314, and a priority data identifier 316. Embodiments of a format check module having different and/or additional units arranged to check a format of a received data object are possible and contemplated.

Code table identifier 312 in the embodiment shown includes circuitry that identifies the presence of code tables and their correspondence to different portions of the corresponding data object. For example, .jpeg files may include segments that include Huffman tables. Corruption of these Huffman tables can adversely affect the perception of large portions of the image associated with the .jpeg file. Thus, more error correction resources may be allocated to these code tables than to other portions of the data object for which corruption of data is less damaging. Based on identification of code tables within a data object, tunable ECC decoder 10 determines the appropriate amount of error correction resources for each. It is further noted that different code tables may have error correction resources allocated thereto at different rates. For example, a first portion of a data object may define a first group of code tables, while a second portion of the data object defines a second group of code tables. Error correction resources may be allocated to these groups of code tables at different rates (e.g., more error correction resources allocated to the first group than to the second group). Additional discussion of code tables can be found below in reference to FIG. 12.

Progressive encoder identifier 314 in the embodiment shown includes circuitry that identifies data objects and/or portions thereof in which progressive formats are present. A first layer may define a baseline level of encoded information, while one or more additional layers that define one or more respective additional levels of details of encoded information. Again, using .jpeg as an example, some image files encoded in this format have multiple layers that progressively affect the perception of the corresponding image. Errors in the outer layers may have less of an effect than errors in the inner layers (an example of a data object having layers and a method for progressive encoding of the same is discussed below in reference to FIGS. 13A and 13B). Accordingly, allocation of error correction resources may progressively increase in amount when moving from the outer layers to the inner layers. Progressive encoder identifier 314 in the embodiment shown identifies examples such as this so that tunable ECC encoder may allocate error correction resources accordingly.

Priority data identifier 316 in the embodiment shown includes circuitry that identifies data by relative priority in the data object. This can include identifying of less importance within a data object or that may otherwise be redundant. Thus, if a second portion of a data object has lower priority information than a first portion, priority data identifier 316 can identify such an arrangement based on, e.g., metadata associated with the data object. For example, a thumbnail within an image file is generally less important than the main portion(s) of the image itself. Accordingly, fewer error correction resources may be applied to the thumbnail than the main portion(s) of the image file. Accordingly, priority data identifier 316 in the embodiment shown identifies data object types having low priority data, as well as identifying the portion(s) of that data object where the redundant data resides.

Figure 5:
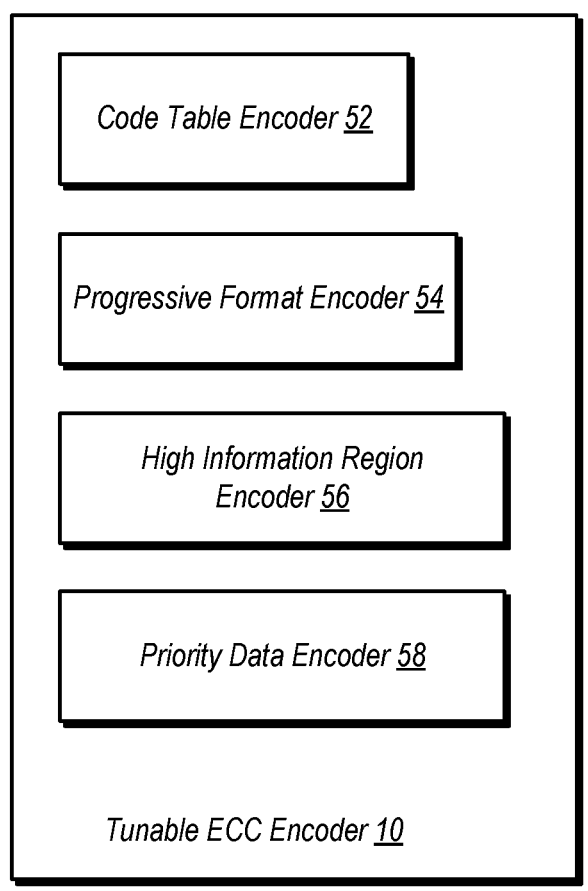
FIG. 5 is a block diagram of one embodiment of a tunable ECC encoder.

FIG. 5 is a block diagram of one embodiment of a tunable ECC encoder. In the embodiment shown, tunable ECC encoder 10 implements circuitry including a code table encoder 52, a progressive format encoder 54, a high information region encoder 56, and a priority data encoder 58. It is noted that this embodiment is shown by way of example, but is not intended to be limiting. Embodiments having various units arranged to encode a large number of data types and arrangements are possible and contemplated, and may fall within the scope of a tunable ECC encoder used to perform data dependent allocation of error correction resources in accordance with this disclosure.

The different circuit units of tunable ECC encoder 10 perform allocation of error correction resources based on the information provided by format check module 31. Code table encoder 52 allocates error correction resources based on the presence of code tables within a data object, as determined by code table identifier 312. Progressive format encoder 54 allocates error correction resources based on a progressive format as identified by progressive encoder identifier 314 (e.g., progressively increasing the amount of allocated error correction resources proceeding from outer layers to inner layers). High information region encoder 56 allocates more error correction resources to portions of a data object that include more information relative to other portions, and may also be used in the performance of sequential encoding as discussed below in reference to FIG. 14 (e.g., where a second portion of a data object is encoded based on a first portion such that corruption of the first portion affect the ability of the second portion to be decoded). Priority data encoder 58 allocates fewer error correction resources to portions of a data object that are of relatively low importance or that include portions of redundant data for which allocated error correction resources can be re-used.

In addition to the various units shown in FIGS. 3-5, embodiments of these elements are possible and contemplated in which additional and/or different units/circuitry are included within. Such units may include circuitry for identifying and/or allocating error correction resources to different types of data objects and different portions included therein. Generally speaking, each of these elements may be tailored to the application in which they are to be used while implementing the ability to perform data-dependent allocation of error correction resources.

Figure 6:
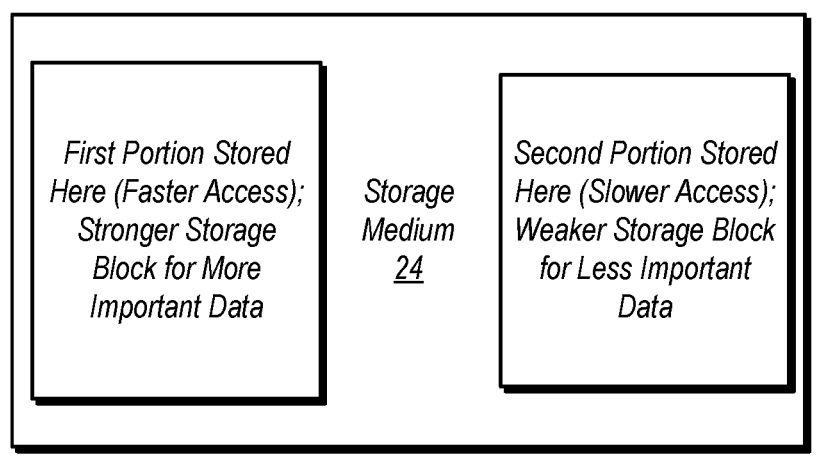
FIG. 6 is a block diagram of one embodiment of a storage medium.

FIG. 6 is a block diagram of one embodiment of a storage medium. Storage medium 24 in the embodiment shown may be any type of persistent memory or storage medium, such as flash or other non-volatile memory, various types of random access memory, magnetic storage, or disk storage, among other examples. Generally speaking, one embodiment of a storage controller may cause a storage medium 24 (or memory medium) to store a first portion of a data object in a first region and a second portion of the data object in a second region, wherein the first region provides faster access than the second region. In addition to the speed of access, a storage controller according to the disclosure may cause different portions to be stored in selected regions based on reliability factors, such as number of program/erase cycles, and so on. Accordingly, FIG. 6 illustrates a manner in which portions of a data object can be stored on storage medium 24 based on characteristics of those portions. For example, for data objects having a progressive format, as discussed above, inner layers may be stored in faster and/or more reliable sections of storage medium 24 than outer layers. To use another example, portions of a data object that are more easily corrupted, more sensitive to corruption, or generally more important to the overall data object may be stored in the faster and/or more reliable portions of storage medium 24 relative to portions that are less easily corrupted, less sensitive to corruption, or less important.

Figure 7:
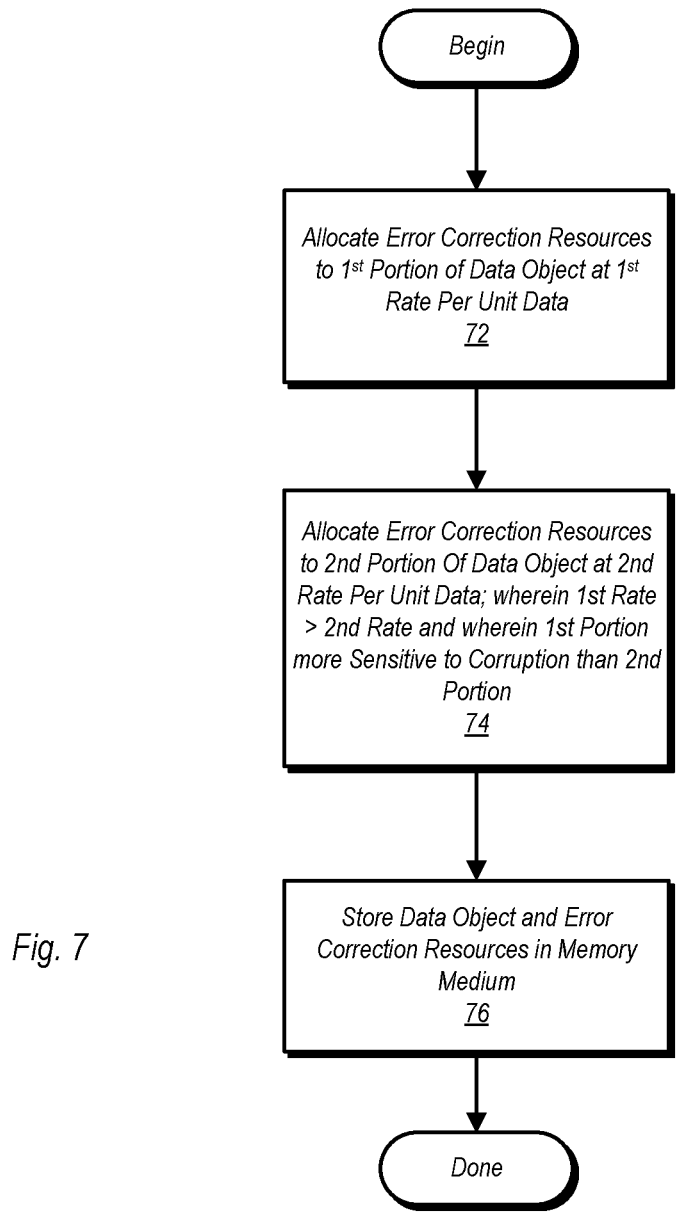
FIG. 7 is a flow diagram illustrating one embodiment of a method for operating a storage controller.

FIG. 7 is a flow diagram illustrating one embodiment of a method for operating a storage controller. Method 70 as disclosed herein may be performed by any of the various hardware embodiments discussed above, as well as others not explicitly disclosed herein. Furthermore, while method 70 is directed to a data object having two different portions, there is no theoretical upper limit to the number of portions of a data object to which a variation of method 70 may be applied. Accordingly, method 70 is extendable for any desired number of different portion of a data object.

Method 70 begins with the allocation of error correction resources to a first portion of a data object at a first rate per unit of data (block 72). The method further includes allocating error correction resources to a second portion of a data object at a second rate per unit of data (block 74). The second rate is less than the first rate, as the first portion may be more sensitive to corruption than the second portion. The first and second portions of the data object may be distinguished from each other in various ways. For example, data in the first portion of the data object may differ from the second portion in terms of the characteristics of the data therein, its location or layer within the data object, susceptibility to corruption, importance to the integrity of the data object, or any other suitable mechanism for distinguishing between portions of a data object.

Following the allocation of error correction resources as described above, the data object, along with the allocated error correction information, are stored in a storage or memory medium (block 76). The memory medium, or storage medium, may be of any type as discussed within this disclosure.

Figure 8:
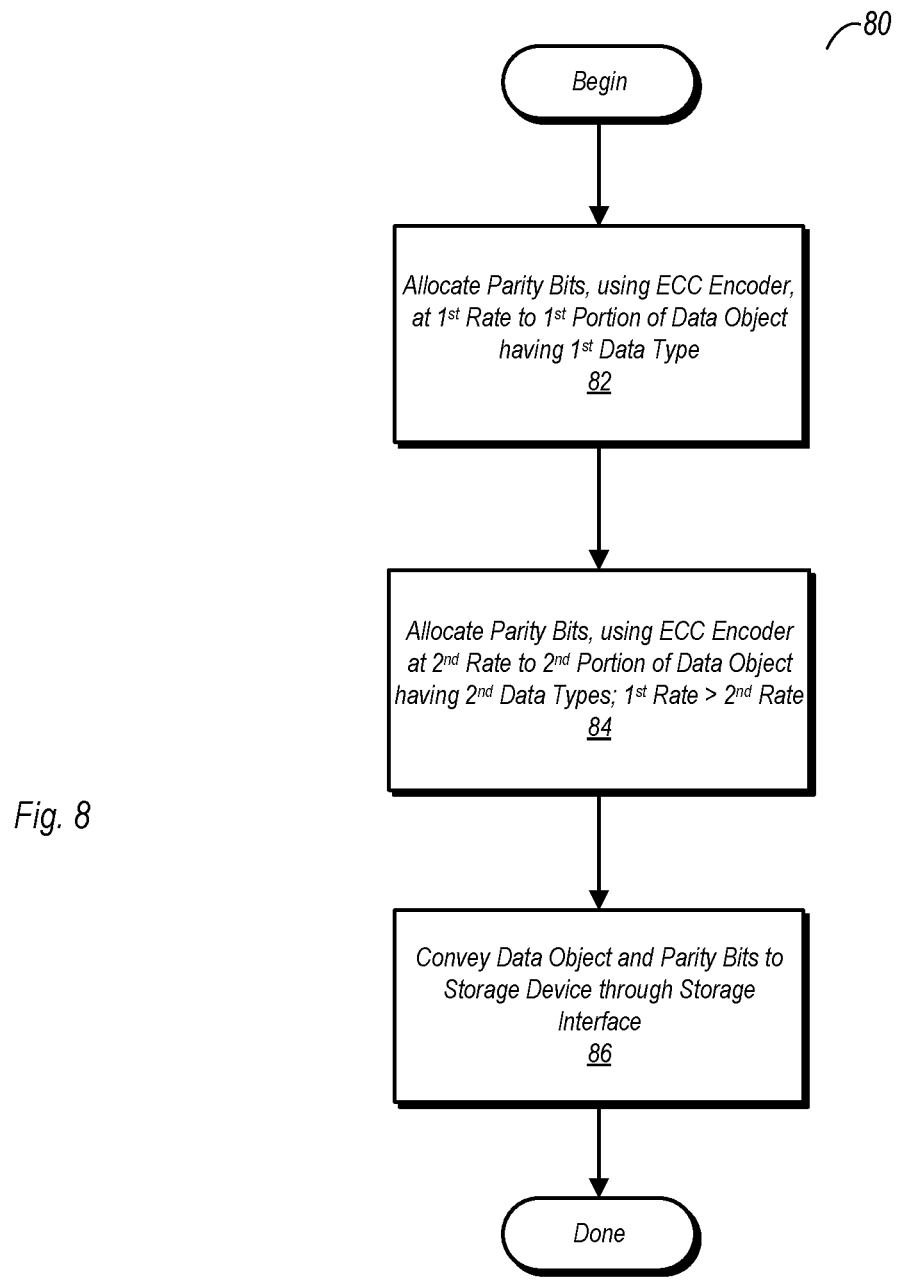
FIG. 8 is a flow diagram illustrating another embodiment of a method for operating a storage controller.

FIG. 8 is a flow diagram illustrating another embodiment of a method for operating a storage controller. As with method 70 discussed above, method 80 as disclosed herein may be performed by any of the various hardware embodiments discussed above, as well as others not explicitly disclosed herein, and may be extendable to data objects having any number of different portions.

Method 80 includes allocating parity bits, using an ECC encoder, at a first rate per unit of data to a first portion of a data object, the first portion have a first data type (block 82). The parity bits are one form of the error correction resources discussed herein, and may be allocated according to an error correction code. The method further includes the allocating parity bits, using the ECC encoder, at a second rate per unit of data, to a second portion of the data object having a different data type (block 84). The first rate is greater than the second rate, while the second portion is less sensitive to corruption than the first portion. Accordingly, the parity bits are allocated at different rates based on different sensitivities to corruption. To use one non-limiting example, for the first portion, three parity bits may be allocated per byte of data, while for the second portion (which is less sensitive to corruption than the first), only two parity bits are allocated per byte of data. Upon completing the allocation of parity bits to the different portions, the data object, along with the parity bits, may be conveyed to a storage device via a storage or memory interface.

Figure 9:
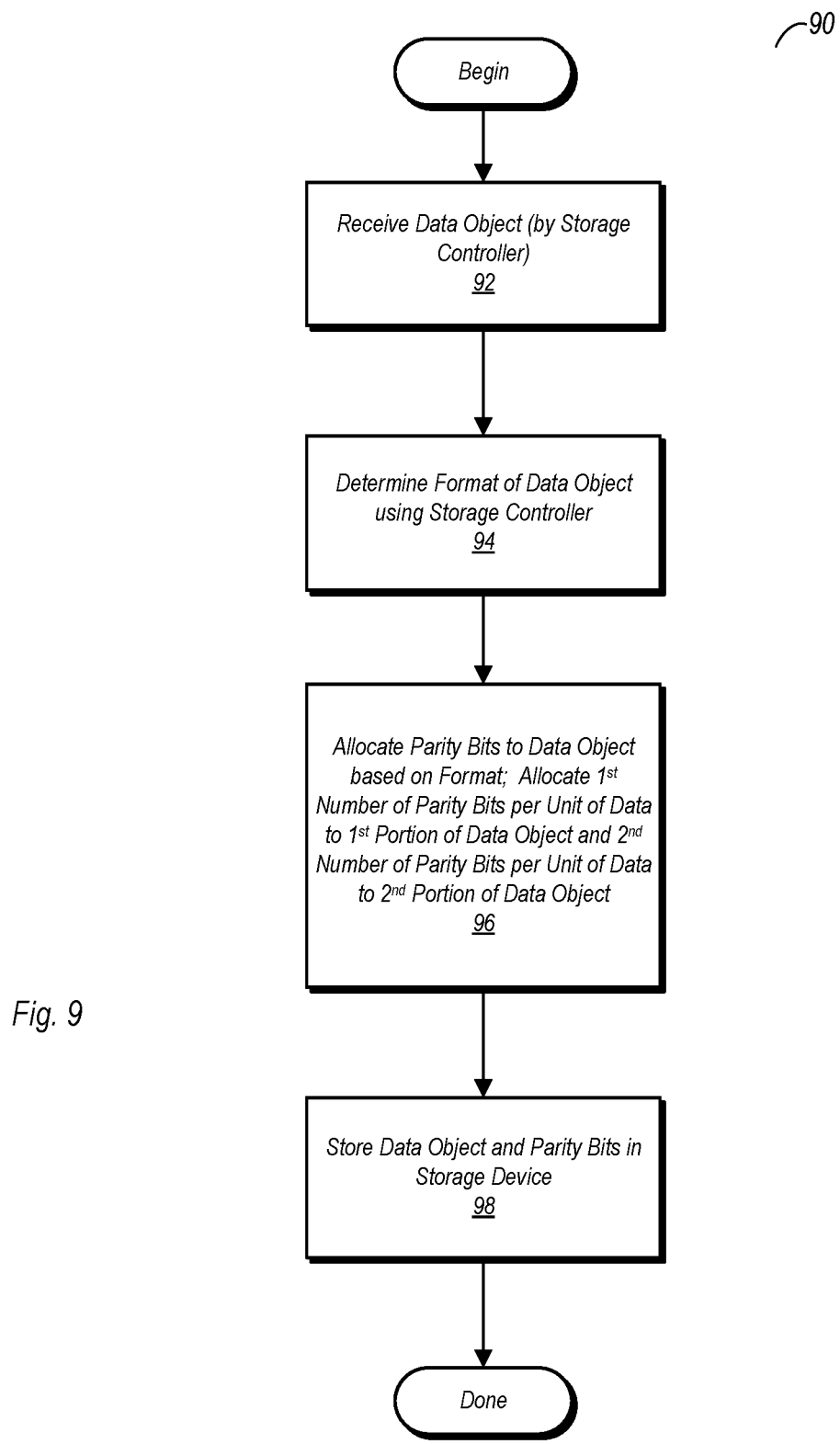
FIG. 9 is a flow diagram illustrating one embodiment of a method for allocating parity bits to a data object.

FIG. 9 is a flow diagram illustrating one embodiment of a method for allocating parity bits to a data object. As with the other embodiments discussed above, method 90 may be performed by any of the hardware embodiments discussed herein, and further, may be performed on data object having a number of portions different than the two used in this example.

Method 90 begins with a storage controller receiving a data object (block 92). Upon receipt or soon thereafter, a format of the data object is determined using circuitry within the storage controller (block 94). Upon determining the format of the data object, circuitry in the storage controller allocates parity bits based thereon. A first number of parity bits per unit of data are allocated to a first portion of the data object and a second number of parity bits are allocated to a second portion (block 96). The first and second numbers are different from one another, while the first and second portions of the data object may be distinguished from one another in any manner discussed herein. For example, allocating parity bits to the first and second portions may include allocating parity bits based on the unique characteristics (e.g., different data types) of each of the first and second portions. Method 90 concludes with the storing of the data object and associated parity bits in a storage device (block 98).

Although not explicitly shown in FIG. 9, an extension of the methodology illustrated therein, extending to the reading/decoding side of the operation is possible and contemplated. Such a method includes the storage controller reading a data object from the storage device. The method further includes the storage controller determining if any errors are present in the first portion of the data object using the parity bits allocated thereto, as well as determining if any error are present in the second portion of the data object using its correspondingly allocated parity bits. The storage controller then corrects any errors determined to be present in either of the first and second portions.

Figure 10:
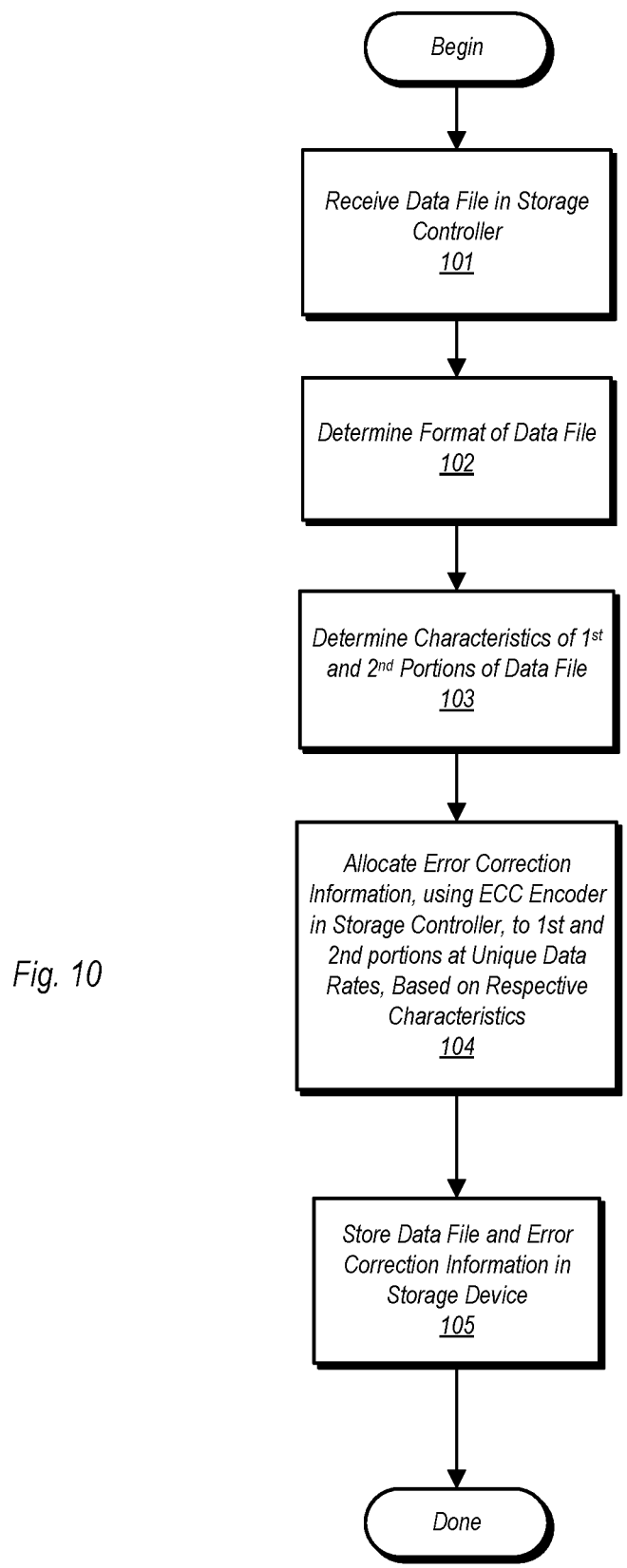
FIG. 10 is a flow diagram illustrating one embodiment of a method for allocating error correction information to a data object.

FIG. 10 is a flow diagram illustrating one embodiment of a method for allocating error correction information to a data object. The caveats applied to method 70, 80, and 90 as discussed above also apply to method 100.

Method 100 begins with the receiving of a data file in a storage controller (block 101), the storage controller including an ECC encoder. After the data file is received, a format of the file is determined by circuitry (e.g., the ECC encoder) within the storage controller (block 102). Based at least in part on this determination, circuitry in the storage controller then determines characteristics of first and second portions of the data file (block 103). For example, using metadata in the data file, the ECC encoder may determine that data in a second portion of the data file corresponds to lower priority information than data in a first portion of the data file.

Using the format information and the information regarding the characteristics of the different portions of the data file, and ECC encoder allocates error correction information to the first and second portions of the data file, at data rates unique with respect to one another, based on the respective characteristics of each (block 104). Thereafter, the data file and its corresponding error correction information are stored in a storage device (block 105).

Although not explicitly shown in FIG. 10, a reading/decoding side of the operation may be performed as follows.

The storage controller may read the data file from the storage device and determine, using an ECC decoder, if any errors are present in the first portion using error correction information allocated thereto. Using the ECC decoder, the storage controller may also determine if errors are present in the second portion using its correspondingly allocated error correction information. Finally, circuitry in the storage controller corrects errors, if any, that are found in the first or second portions. Thereafter, the storage controller provides the data file to a host device.

Figure 11:
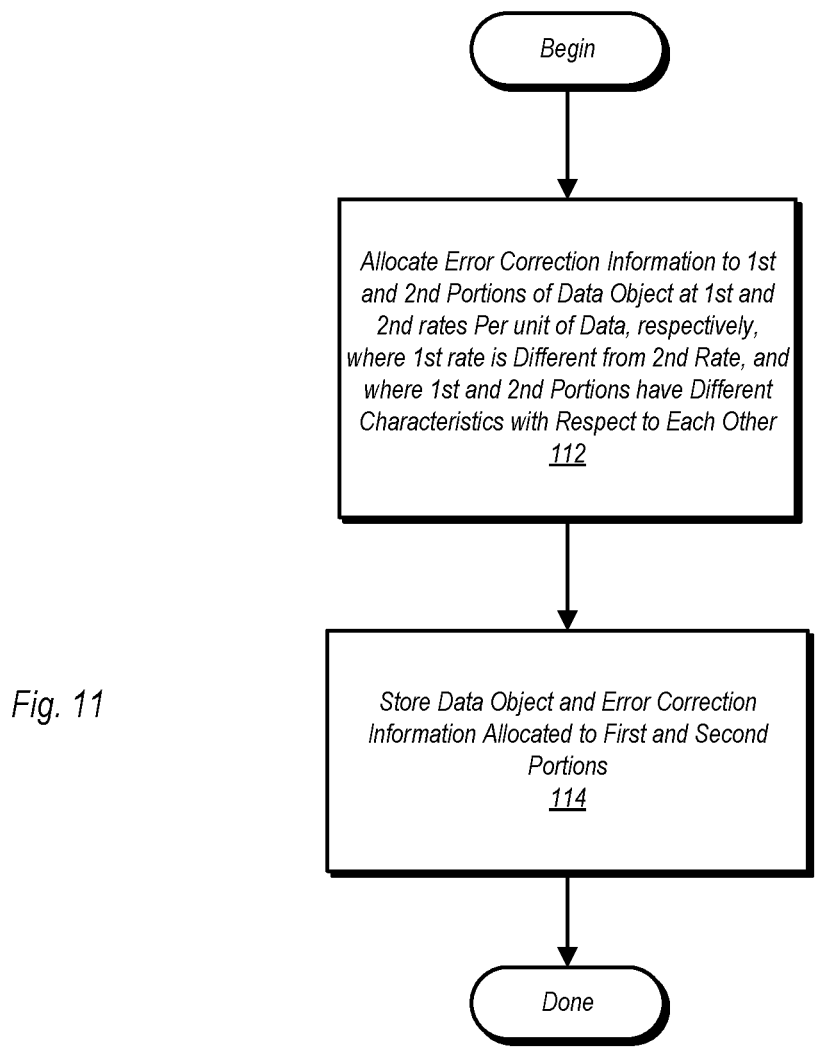
FIG. 11 is a flow diagram illustrating another embodiment of a method for allocating error correction information.

FIG. 11 is a flow diagram illustrating another embodiment of a method for allocating error correction information. The caveats applied to method 70, 80, 90, and 100 as discussed above further apply to method 110.

Method 110 includes allocating error correction information to first and second portions of a data object at first and second data rates, respectively (block 112), by, e.g., a storage controller. The first and second data rates are different with respect to one another, and refer to the amount of error correction information allocated per unit of data (e.g., number of parity bits per byte). The difference in the amount of error correction information per unit of data is based on the first and second portions of the data object having differing characteristics with respect to each other. The data object and the error correction information allocated to the first and second portions are then stored in a persistent storage medium, such as a solid-state storage medium.

Figure 12:
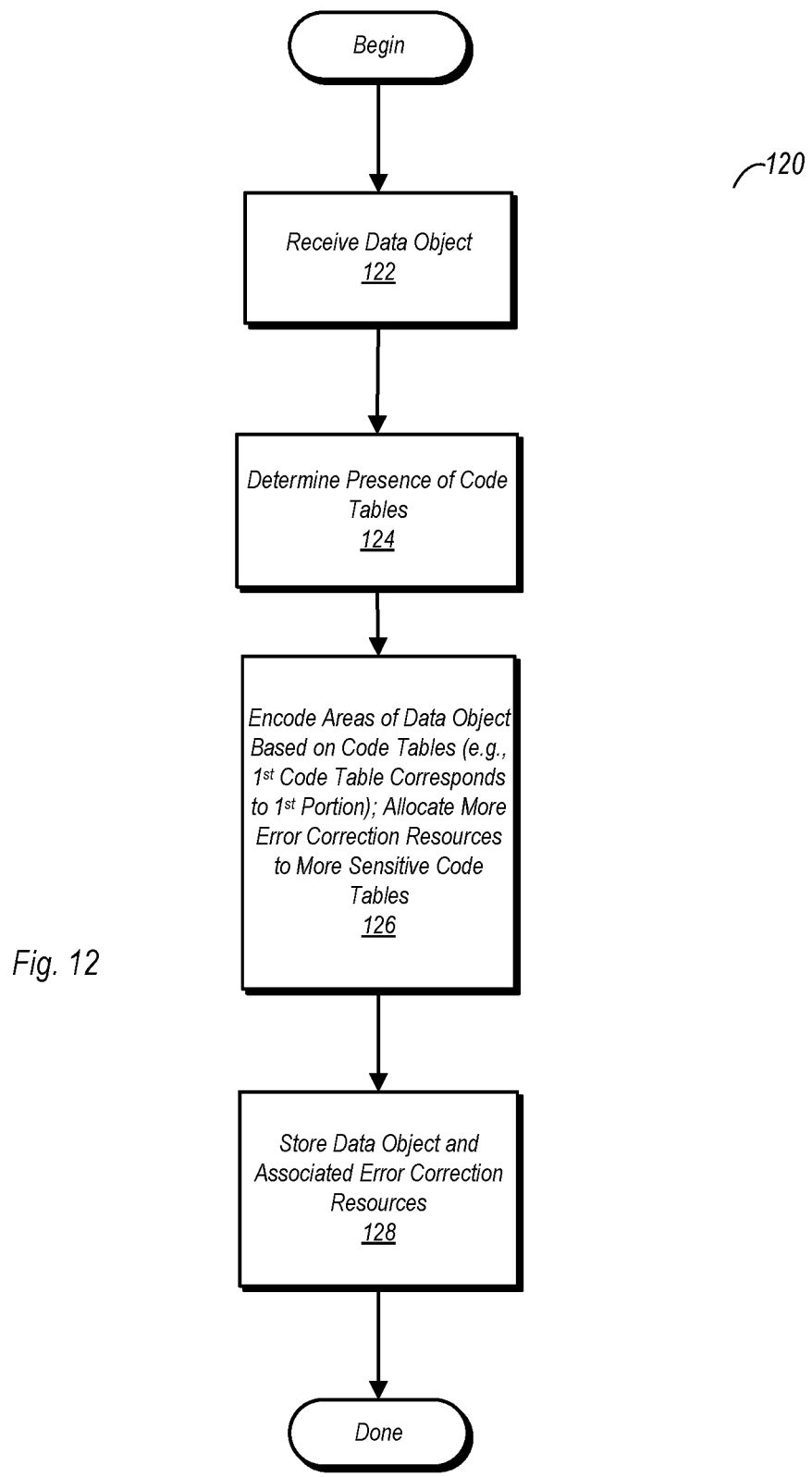
FIG. 12 is a flow diagram of illustrating one embodiment of a method for allocating error correction information based on code tables.

FIG. 12 is a flow diagram of illustrating one embodiment of a method for allocating error correction information based on code tables. Method 120 in the embodiment shown may be performed by hardware that includes a code table identifier (such as that discussed above) or similar circuitry. The number of portions to which method 120 may apply is not limited to any specific number.

Method 120 begins with the receiving of a data object (block 122). Thereafter, the presence of code tables is determined (block 124). In addition to determining the presence of the code tables, a determination of the sensitivity of each is also performed. Areas or portions of the data object are then encoded with error correction resources, with more error correction resources allocated to more sensitive code tables (block 126). The method further includes storing the data object and associated error correction resources, as allocated herein.

Figure 13A:
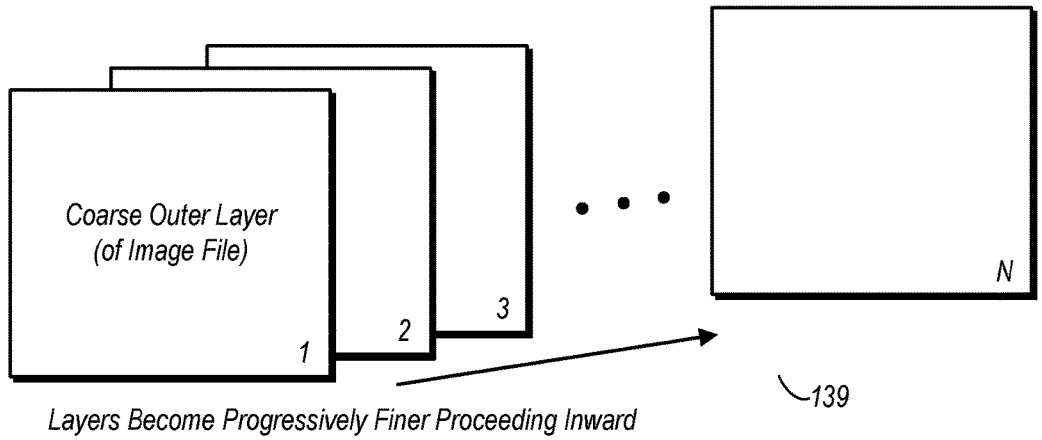
FIG. 13a is a block diagram illustrating one embodiment of a data object having multiple layers.
Figure 13B:
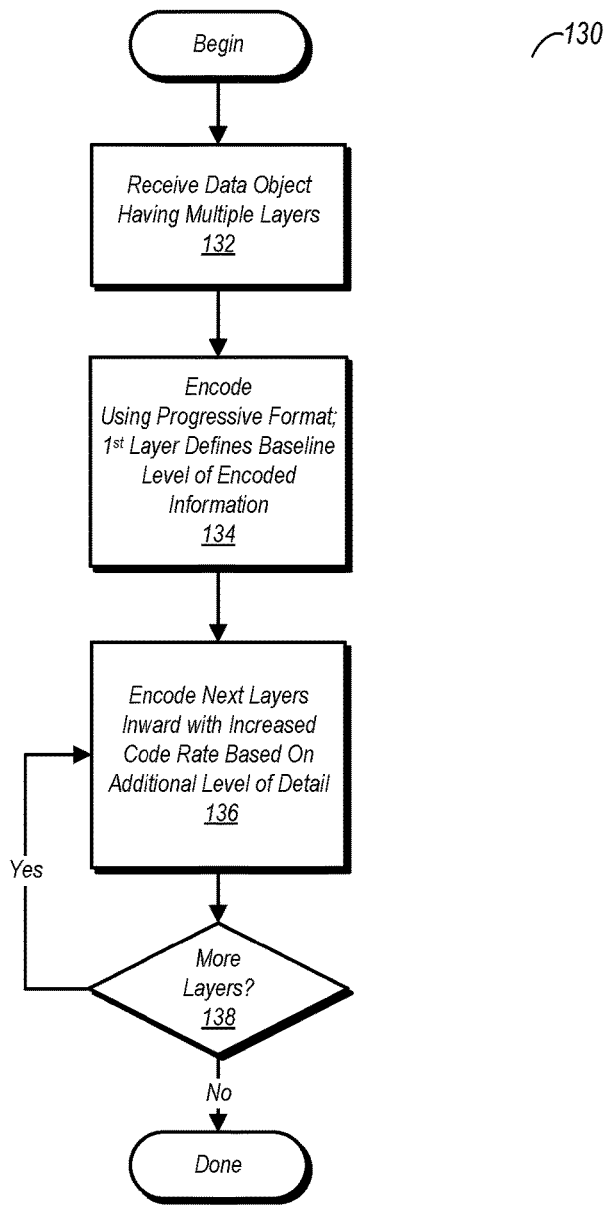
FIG. 13b is a flow diagram illustrating one embodiment of encoding a data object using a progressive format.

FIG. 13a is a block diagram illustrating one embodiment of a data object having multiple layers, while FIG. 13b is a flow diagram illustrating one embodiment of encoding a data object using a progressive format. In FIG. 13a, an image file 139 is used as an example of a data object having multiple layers, although the corresponding methodology of method 130 is not limited to image files. Furthermore, while the progressivity of encoding is from outer layers to inner layers as discussed herein, the disclosed embodiment is not limited in this manner. Generally speaking, one layer (e.g., that which is least sensitive and/or susceptible to corruption) may provide a baseline level of encoding, with the level of encoding progressively increasing with each layer subsequently encoded. In an alternative embodiment, an ECC encoder may allocate error correction information at a first rate for a first subset of layers and at a second rate for a second subset of layers, where the first rate is greater than the second rate.

With regard to image file 139, a number of layers are included in the file. The layers of data object 139 as shown here include layers 1 to some number N, with layer 1 being the outermost layer and layer N being the innermost layer. The outermost layer includes the coarsest level of image detail, while the innermost layer includes the finest level of detail. Thus, if the layers of the image were to be displayed sequentially, from the outermost layer to the innermost, the image quality would be relatively low at the beginning and progressively improve as each additional layer was displayed. In accordance with the progressivity of detail as the layers progress from outer to inner, the sensitivity of each layer to data corruption increases correspondingly. Due to this property, the present disclosure contemplates a progressive encoding method which is now discussed with reference to FIG. 13b.

Method 130 may be performed in a tunable ECC encoder having the capability for performing progressive encoding, such as the example discussed above. The method begins with the receiving of a data object having multiple layers (block 132). Encoding (e.g., allocating error correction resources) is the performed using a progressive format, with the first (e.g., outer) layer providing a baseline level of encoding (block 134). The next layer inward is then encoded with an increase code rate, based on the additional level of detail (block 136). If there are additional layers to encode (block 138, yes), the method returns to block 136, again increasing the level of encoding over the previous layer. If there are no more layers to be encoded (block 138, no), the progressive encoding method 130 is complete. Thereafter, in storage environments, the data object and associated error correction resources may be stored on a persistent storage medium (e.g., flash memory), with the more sensitive inner layers being stored in areas that are more reliable and/or having faster access. An example of an area having higher reliability may be a portion of a flash memory having undergone fewer program/erase cycles than other portions.

Figure 14:
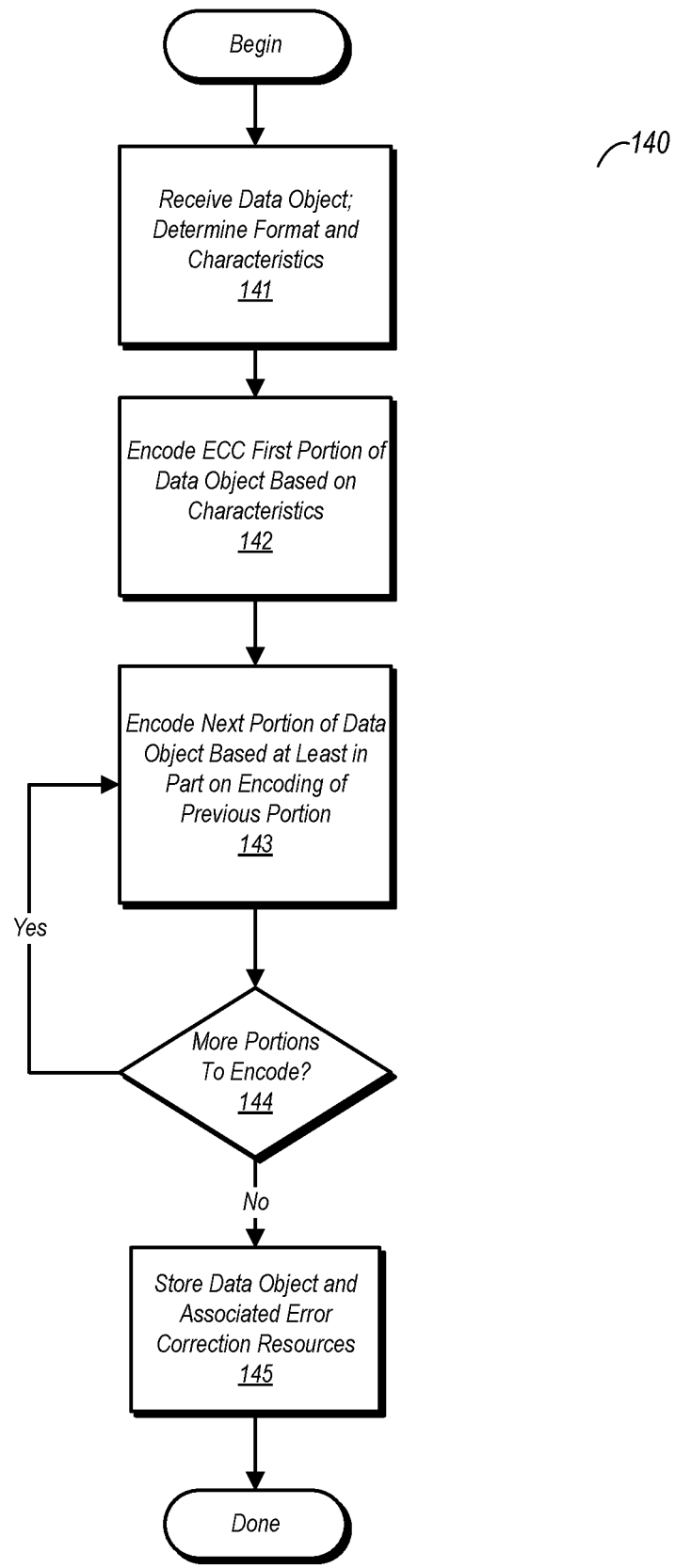
FIG. 14 is a flow diagram illustrating one embodiment of a method for encoding portions of a data object based at least in part on other portions of the data object.

FIG. 14 is a flow diagram illustrating one embodiment of a method for encoding portions of a data object based at least in part on other portions of the data object. In this embodiment, the encoding is based on some portions of a data object having a dependency on other portions thereof. This dependency can manifest itself in various ways, such as location of the various portions relative to one another when the data object is stored as a single unit. For example, a data file in the WebP image format, encoding of a particular block of information may be based on one or more adjacent blocks of data. The methodology of encoding discussed in reference to FIG. 14 may also be based on the order in which portions of the data object are read when accessed as intended. For example, information in some image file formats may have more importance near the beginning of the file (e.g., the beginning portions to be read) than toward the end of the file.

Method 140 can be performed using a tunable ECC encoder having the capability of performing sequential encoding, including in embodiments discussed above. In the embodiment shown, method 140 begins with the receiving of a data object and the determination of the format and characteristics of the various portions contained therein (block 141). After the characteristics of the various portions have been determined, a first portion is encoded with error correction information based on its characteristics (block 142). The next portion of the data object is then encoded based at least in part on the encoding of the previous portion (block 143). Since the next portion of the data object to be encoded has a sequential dependency on the previous portion, corruption of the previous portion affects the ability of the next portion to be decoded.

If there are more portions of the data object to be encoded (block 144, yes), the method returns to block 143, and the next portion is encoded based at least in part on its dependency on the previously encoded portion. If there are no more portions of the data object to be encoded (block 144, no), the data object and associated error correction resources may then be stored (block 145).

Figure 15:
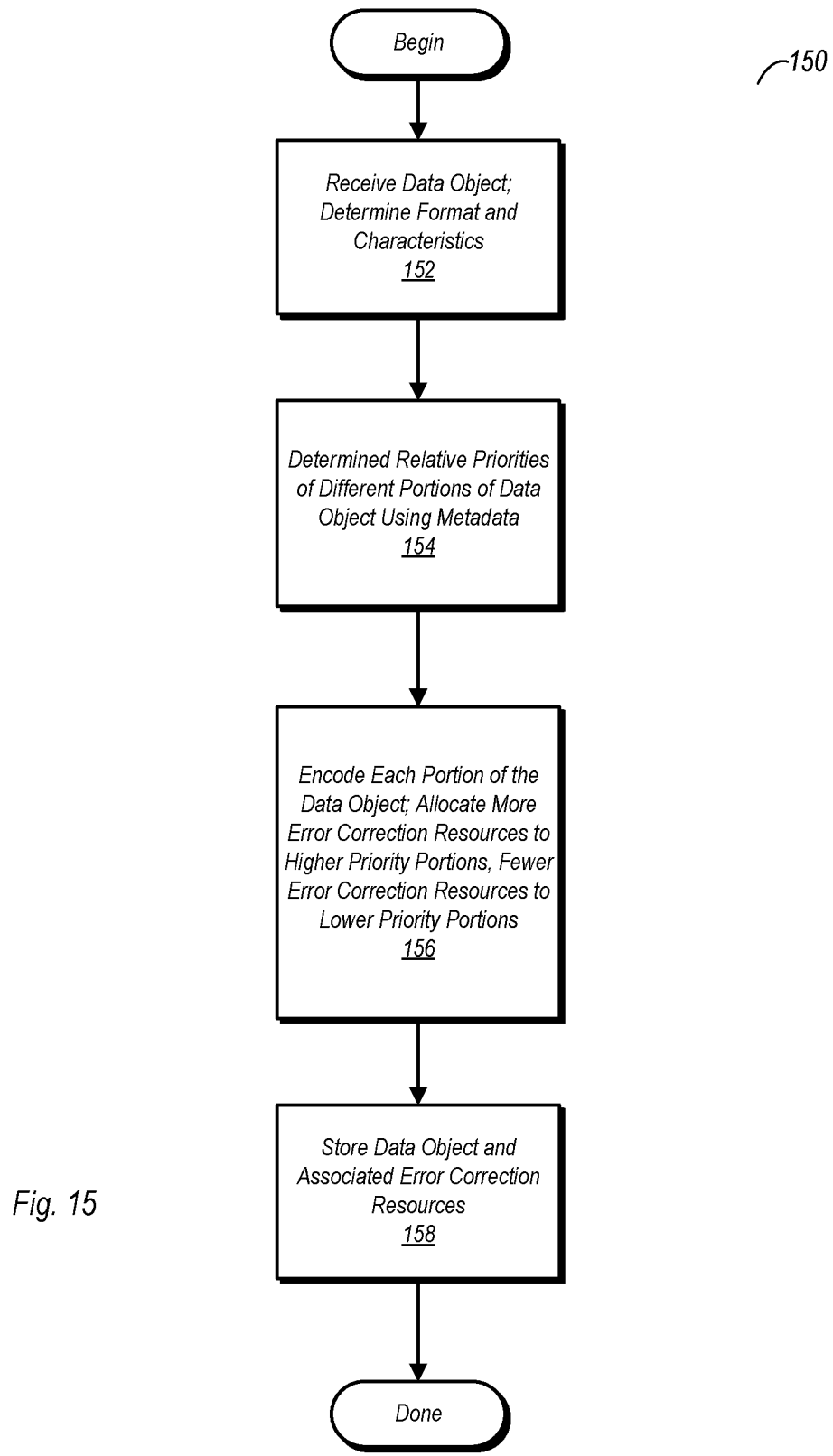
FIG. 15 is a flow diagram illustrating one embodiment of a method for encoding different portions of a data object with different amounts of error correction resources based on priority of each portion.

FIG. 15 is a flow diagram illustrating one embodiment of a method for encoding different portions of a data object with different amounts of error correction resources based on priority of each portion. Method 150 may be performed using, e.g., various embodiments of tunable ECC encoder 10 discussed above.

Method 150 begins with the receiving of a data object and the determination of its format and characteristics (block 152). Based on the characteristics of the various portions, a determination of the relative priority of each, using metadata, is then performed (block 154). Each portion of the data object is then encoded, with more error correction resources allocated to higher priority portions and fewer error correction resources allocated to the lower priority portion (block 156). Using the .mp3 music file discussed above as an example, more error correction resources may be allocated to those portions of the file corresponding to the actual music, while fewer error correction resources are allocated to those portions corresponding to things such as the lyrics, album artwork, song information (e.g., genre, year of release, etc.). Upon completion of the allocation of error correction resources, the data object and associated error correction resources are then stored (block 158).

Figure 16:
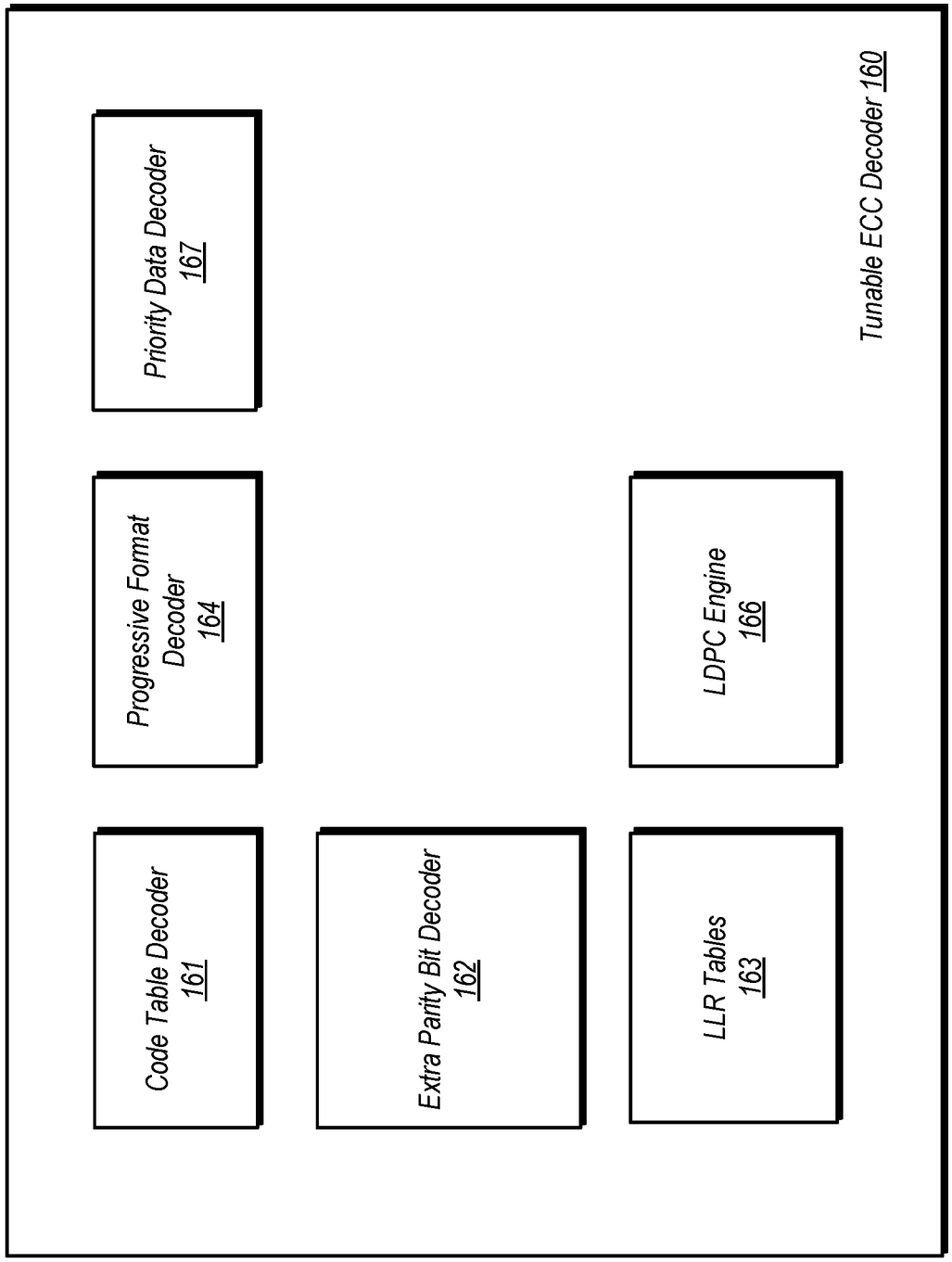
FIG. 16 is a block diagram of one embodiment of a tunable ECC decoder.

Error Detection and Correction:

FIG. 16 is a block diagram of one embodiment of a tunable ECC decoder. In the embodiment shown, tunable ECC decoder 160 includes various units of circuitry used to check for errors and correct any, if found. These various circuit units may further communicate with one another in cases where both hard bit and soft bit decoding are performed in the checking and correcting of errors. It is further noted that, due to the different types of data that may be stored in a single data object, multiple ones of the various units shown here may be utilized to perform error checking and correction for the same.

Tunable ECC decoder 160 in the embodiment shown includes a code table decoder 161. This unit of tunable ECC decoder 160 performs error checking and correction for data objects having code tables and to which error correction resources were allocated by, e.g., code table encoder 52, of FIG. 5. Progressive format decoder 164 in the embodiment shown performs error checking and correction for portions of a data object in which progressive encoding was performed in allocating error correction resources (e.g., by progressive format encoder 54 of FIG. 5). Extra parity bit decoder 162 performs decoding of certain portions of a data object having extra parity bits allocated thereto (those portions having a high amount of information, encoded by, e.g., high information region encoder 56 of FIG. 5). Priority data decoder 167 performs error checking and correction for portions having data of a lower priority (e.g., as encoded by priority data encoder 58, of FIG. 5).

Each of the above units (as well as certain other ones that may be present in various embodiments) may perform hard bit decoding. That is, it may base its error correction and detection based simply on whether or not given bits are read as logic 1's or logic 0's. Tunable ECC decoder 160 in the embodiment shown also includes log likelihood ratio (LLR) tables 163 and a low density parity check (LDPC) engine 166. These units may further enhance error correction and detection using soft bit encoding, which provides an assessment as to the reliability of each hard bit result.

Figure 19:
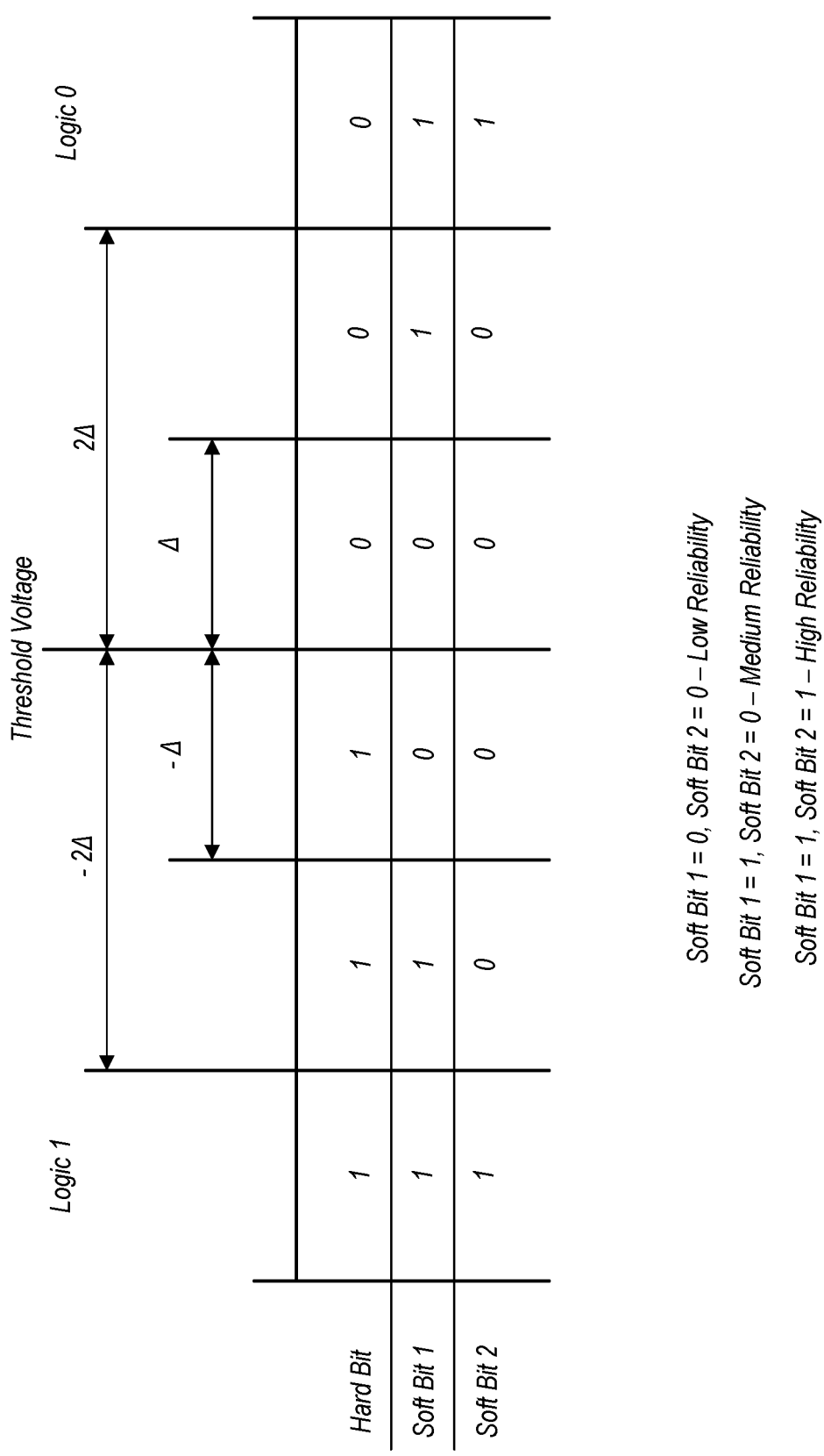
FIG. 19 is a graphic illustrating one embodiment of a methodology for determining the reliability of a data bit read during encoding.

LLR tables 163 in the embodiment shown may be arranged either as a single table having different correction values for different portions of a data object, or may be arranged as a number of tables each corresponding to a different region. In embodiments where multiple LLR tables are present, each LLR table corresponds to a unique data type or different portions of various data objects. In embodiments in which a single table is implemented having different correction values for different portions, the different portions may correspond to different, unique data types with respect to one another. Irrespective of the arrangement, an LLR table may include a number of entries each having reliability scores for a plurality of voltage ranges in which a bit may be read. A general example illustrating an arrangement of an LLR table entry is shown in FIG. 19 and discussed in further detail below. ECC decoder 160 may, responsive to the storage controller receiving a data file/object, determine if errors are present in various portions of the file/object based in part on the information stored in the LLR table(s). Generally speaking, the information provided by LLR tables 163 may be used to determine, for each bit of a data object, the likelihood that it has been accurately read. Furthermore, when hard bit errors are detected, the information indicating the likelihood that bits have been accurately read may be used to aid in determining which bits are erroneous.

LDPC engine 166 in the embodiment shown is used in conjunction with the LLR tables in performing soft bit decoding and thus determining if errors are present in data received by the storage controller. In one embodiment, LDPC engine 166 may operate in one of a number of different modes depending on a region of data for which a presence of errors is to be determined. Circuitry to measure the actual voltage values at which bits are read may be included in LDPC engine 166. With respect to the number of different modes, one embodiment of LDPC engine 166 may be operated in different power modes, e.g., operating in a first power mode during error checking for a first region of data and in a second power mode for a second region of data. For example, for regions or portions of a data object that are relatively low information or are easily decodable/checked for errors, LDPC engine 166 may be operated in a first power mode in which less power is consumed during the decode operation (e.g., a "low power" mode). For regions or portions of a data object that include more information and/or are more difficult to decode/check for errors, LDPC engine 166 may be operated in a second power mode (e.g., a "full power" mode) in which more power is consumed during the decode operation. As an alternative or an addition to the above, LDPC engine 166 may operate in a first power mode or a second power mode depending on the importance of the region of data within a data file that is being checked for errors.

During operation, hard bit decoding (e.g., simply checking for flipped bits) may be performed by LDPC engine 166 or by other ones of the various functional circuit blocks shown in FIG. 16. The soft bit decoding may be performed by LDPC engine 166, in conjunction with information from LLR tables 163. During soft bit decoding, LDPC engine may operate in accordance with one or more tuning parameters, which may include (but are not limited to) a soft bit delta and/or a read threshold voltage. These parameters are illustrated graphically in FIG. 19 and discussed below in its corresponding description.

Figure 17:
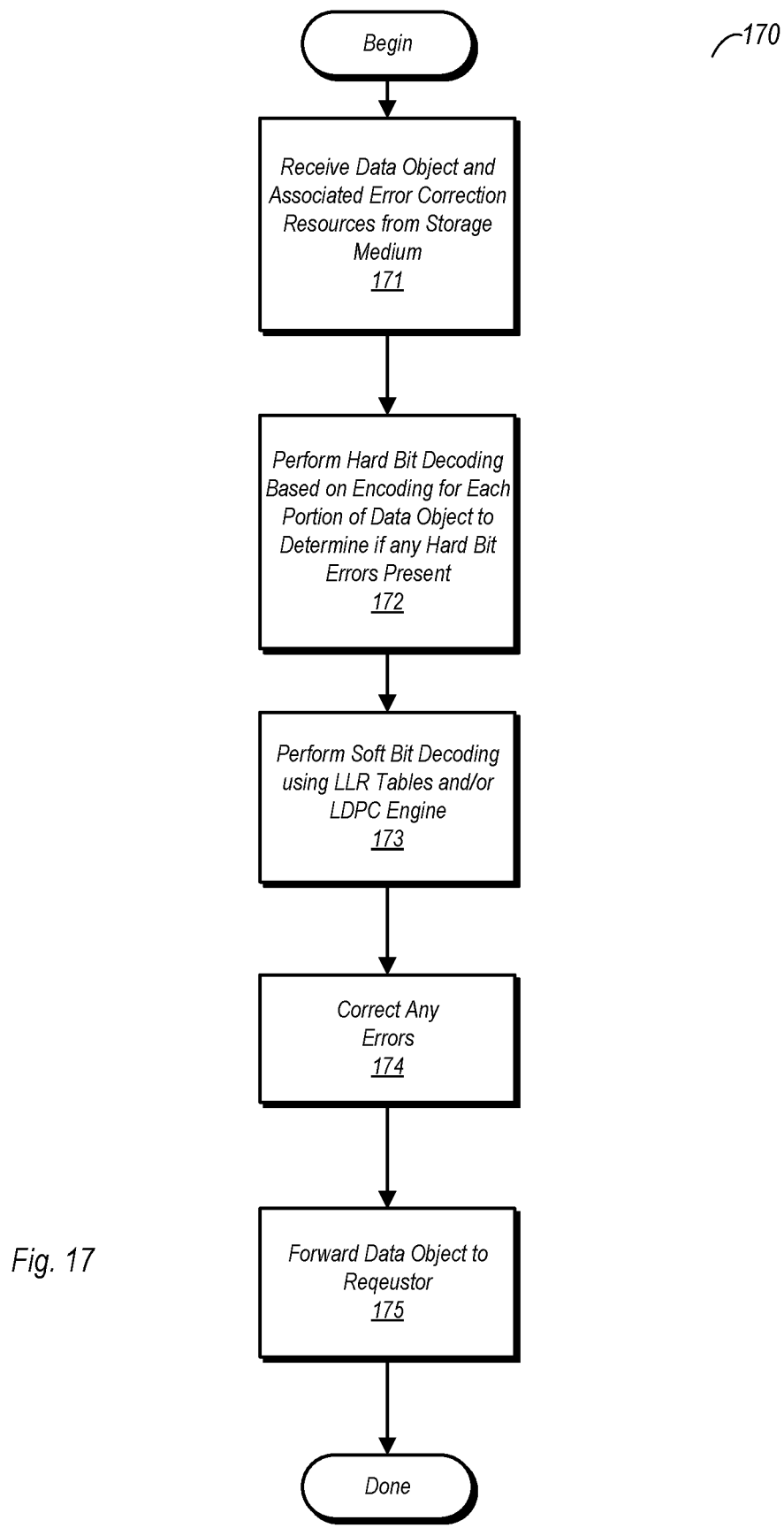
FIG. 17 is a flow diagram of one embodiment of a method for decoding a data object using both hard and soft bit decoding.

FIG. 17 is a flow diagram of one embodiment of a method for decoding a data object using both hard and soft bit decoding. Method 170 in the embodiment shown may be performed by circuitry in a tunable ECC decoder such as that discussed above in reference to FIG. 16, as other embodiments not explicitly discussed herein.

Method 170 begins with the receiving of a data object and its associated error correction resources from, e.g., a storage medium (block 171). Hard bit decoding is the performed based on the encoding for each portion of the data object to determine if any hard bit errors are present (block 172). When performing the hard bit decoding, the value of bits (logic 1 or logic 0) are determined and the previously allocated error correction resources are applied to determine if any errors are present. For example, using parity bits, the hard bit encoding process may determine if the parity of, e.g., a byte of data matches the expected parity.

Soft-bit decoding is then performed using LLR tables and/or an LDPC engine (block 173). For each bit of data that is read, the soft-bit decoding process may determine its reliability based on, e.g., a delta between the actual measured voltage of the bit and the threshold voltage for distinguishing the bit value. It is noted that embodiments are possible and contemplated where the soft-bit decoding portion may be optional depending on whether hard bit errors are detected. For example, in one alternative embodiment, if the hard bit decoding process determines that no errors are present in a particular byte of data, soft bit decoding for that byte may be skipped.

Method 170 further includes the correcting of any detected errors (block 174). As noted above, the use of soft bit decoding may aid in the identifying of particular bits that are in error, based on their reliability as determined from, e.g., information stored in the LLR tables. Upon completing the error detection and correction of any errors found, the data object may be forwarded to a requestor (block 175), such as a host device coupled to a storage controller which includes functional circuitry for carrying out the method.

Figure 18:
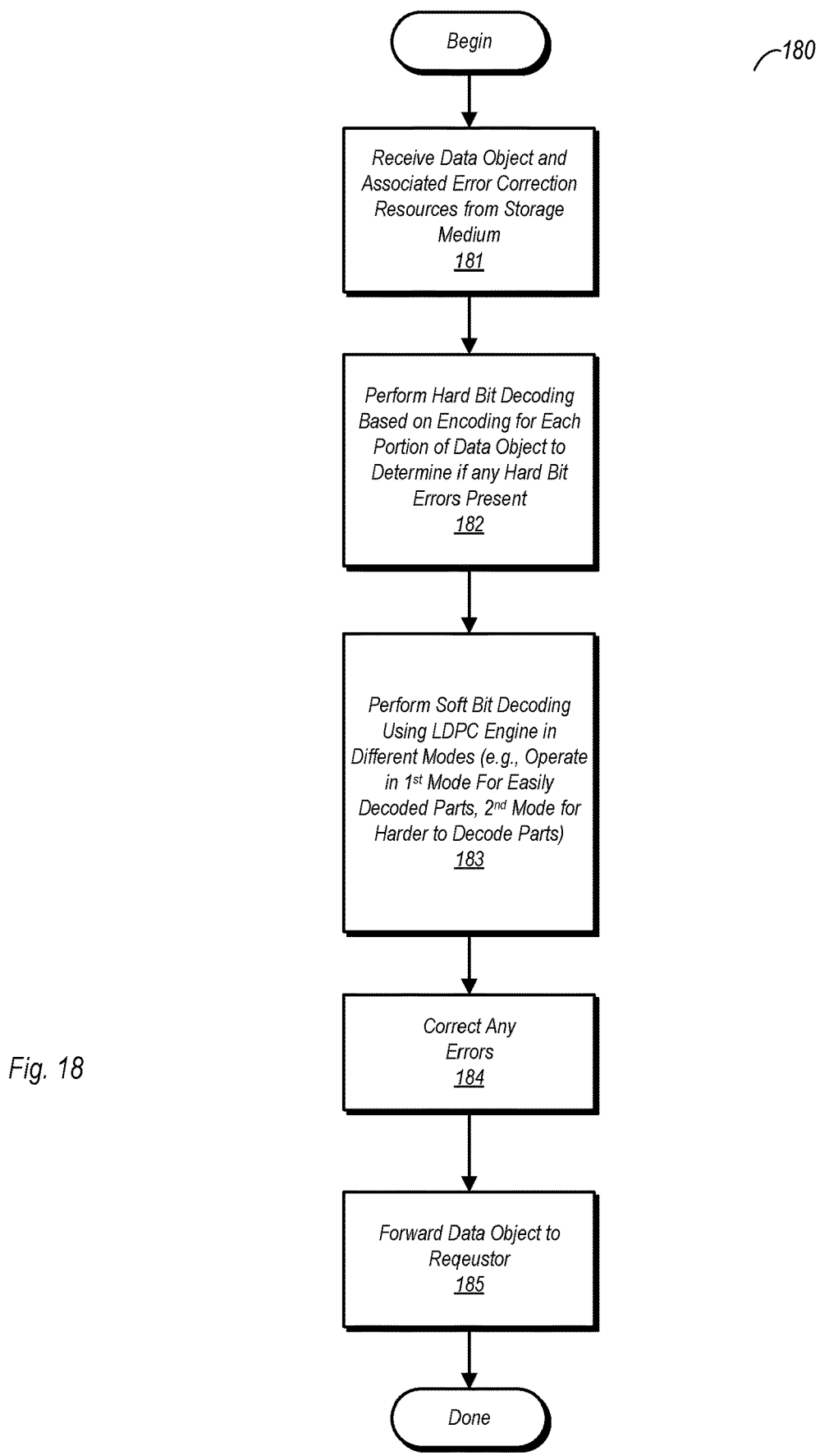
FIG. 18 is a flow diagram illustrating another embodiment of a method for decoding a data object using both hard and soft bit decoding.

FIG. 18 is a flow diagram illustrating another embodiment of a method for decoding a data object using both hard and soft bit decoding. Method 180 may be performed by the embodiment of a tunable ECC decoder discussed above, or other embodiments implemented with the capability of performing the various method steps discussed herein.

Method 180 begins with the receipt of a data object and its corresponding error correction resources from, e.g., a storage medium (block 181). Hard bit decoding, based on the encoding performed to generate the corresponding error correction resources is then performed to determine the presence of any hard bit error (block 182). Subsequent thereto, soft bit decoding is performed, using an LDPC engine operating in different modes (block 183). For easily decoded parts of a data object, a first (e.g., low power) mode may be used for soft bit decoding. For harder to decode parts of the data object, a second (e.g., full power) mode may be used in the performance of soft bit decoding. Any detected errors are then corrected (block 184) and the data object is then forwarded to its requestor (block 185).

FIG. 19 is a graphic illustrating one embodiment of a methodology for determining the reliability of a data bit read during encoding. In particular, FIG. 19 illustrates a soft bit decoding mechanism that, used in conjunction with the hard bit decoding, can more accurately determine not only the presence of errors but particular bits that may be corrupted. This in turn may add another level of robustness to the process of error detection and correction.

The initial determination of whether a bit is determined to be a logic 1 or logic 0, as shown here, is based on a threshold voltage. In the illustrated example, a logic 1 is shown on the left-hand side relative to the boundary delineated by the threshold voltage, while a logic 0 is shown on the right hand side. For the sake of this example, a logic 1 may be considered to have a voltage above the threshold voltage, while a logic 0 may have a value that is below the threshold voltage.

The reliability of a particular bit in this example is determined based on a code determined by the delta of the hard bit voltage and the threshold voltage. When the voltage corresponding to a particular bit is less than a single delta from the threshold voltage, both Soft Bit 1 and Soft Bit 2 are zeros, and the read value of the bit is considered to be low reliability. When the delta between the voltage of the particular bit is more than a single delta, but less than two deltas, Soft Bit 1=1 while Soft Bit 2=0, and the read value of the bit is considered to be medium reliability. Finally, when the delta between the voltage of the particular bit is two or more deltas from the threshold voltage, Soft Bit 1=1 and Soft Bit 2=1, with the read value of the bit being considered to be high reliability.

The use of the soft bit methodology discussed herein can thus aid in determining the location of a failed bit. Consider an example in which a parity check determines that a single bit of a data unit is erroneous. If all but one of the bits are considered high or medium reliability, but one bit of the data unit is low reliability, it is thus likely that the low reliability bit is the one in error. This bit can then be flipped to its complementary value in a tunable ECC decoder, and the parity check can be performed again to determine if error has been cleared.

Example Communications System:

FIG. 20 is a block diagram of one embodiment of an example communications system. In the embodiment shown, communications system 200 is a wireless communication system having two different terminals, labeled here as terminal 1 and terminal 2. It is noted that the disclosure also contemplates other types of communications systems, including both wired and optical systems.

Each of the terminals of communications system 200 as shown here include a tunable ECC encoder 10 and a tunable ECC decoder 160, each of which may operate in accordance with the various embodiments of the same discussed above. Tunable ECC encoder 10 in the embodiment shown performs data-dependent encoding, allocating more error correction resources to certain portions of a data object relative to other portions of the same. The data object and associated error correction resources allocated thereto may be transmitted from one of the terminals to the other. The receiving terminal then routes the received data object and associated error correction resources, where decoding/error checking is performed, as well as the correction of errors. Thus, the data dependent allocation of error correction resources and error checking/correction using the same may be applied in a number of different environments, and generally, to any suitable environment where data is transferred from one location to another. Furthermore, the various embodiments of a tunable ECC encoder and tunable ECC decoder, as discussed above, may be adapted for use in a communications system.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a storage medium configured to store data, the storage medium including a first region and a second region, wherein the first region provides faster access than the second region; and
   a controller configured to:
      allocate error correction resources at a first rate per unit of data to a first portion of a data object;
      allocate error correction resources at a second rate per unit of data to a second portion of the data object, wherein the first rate is greater than the second rate, and wherein the first portion of the data object has a higher sensitivity to data corruption than the second portion; and
      store the data object and the error correction resources allocated to the data object, in the storage medium such that the first portion is stored in the first region and the second portion is stored in the second region.

2. The apparatus as recited in claim 1, wherein the error correction resources include parity bits defined according to an error correcting code (ECC).

3. The apparatus as recited in claim 1, wherein the data object is encoded according to an encoding format that defines a first group of code tables and a second group of code tables, wherein the first portion corresponds to the first group of code tables.

4. The apparatus as recited in claim 1, wherein the data object is encoded according to a progressive encoding format that includes a first layer that defines a baseline level of encoded information and one or more additional layers that define one or more additional levels of detail of the encoded information, wherein the first portion corresponds to one of the one or more additional layers.

5. The apparatus as recited in claim 1, wherein the second portion of the data object is encoded based on the first portion of the data object, so that corruption of the first portion affects an ability of the second portion to be decoded.

6. The apparatus as recited in claim 1, wherein the controller is further configured to identify that the second portion of the data object corresponds to lower priority information than the first portion of the data object based on metadata associated with the data object.

7. A controller comprising:
   a host interface configured to communicate between the controller and a host device;
   a storage interface configured to facilitate communications between the controller and a storage medium, the storage medium including a first region and a second region, wherein the first region provides faster access than the second region; and
   data path circuitry coupled between the host interface and the storage interface, wherein the data path circuitry includes:
      an error correction code (ECC) encoder configured to allocate parity bits to a data object having at least two different data types including a first portion of a first data type and a second portion of a second data type, wherein the ECC encoder is further configured to identify that the second portion of the data object is less sensitive to corruption than the first portion of the data object, wherein the ECC encoder is further configured to allocate parity bits at a first rate per unit of data to the data of the first data type and allocate parity bits at a second rate per unit of data to the data of the second data type, the first rate being greater than the second rate;

wherein the storage interface is further configured to convey the data object, and the allocated parity bits, to the storage medium; and wherein the controller is further configured to cause the storage medium to store the first portion in the first region and to store the second portion in the second region.

8. The controller as recited in claim 7, further comprising an ECC decoder coupled to the storage interface, wherein the ECC decoder is configured to determine if any errors are present in data received by the controller from the storage medium based at least in part on information stored in a plurality of log likelihood ratio (LLR) tables, wherein each of the LLR tables corresponds to a unique data type and includes a plurality of entries, each of the plurality of entries of a given LLR table including reliability scores for a plurality of voltage ranges for individual bits of data read from the storage medium.

9. The controller as recited in claim 7, further comprising an ECC decoder coupled to the storage interface, the ECC decoder configured to determine if any errors are present in data received by the controller from the storage medium, wherein the ECC decoder includes a low density parity code (LDPC) engine configured to operate in one of a plurality of different modes depending on a region of data for which a presence of errors is to be determined.

10. The controller as recited in claim 9, wherein the LDPC engine is further configured to operate in a first power mode during error checking of a first region of data, and further configured to operate in a second power mode during error checking of a second region of data.

11. The controller as recited in claim 9, wherein the LDPC engine is further configured to operate in accordance with one or more tuning parameters, wherein the one or more tuning parameters includes one or more of the following:
a soft bit delta;
a read threshold voltage.

12. A data storage device comprising the controller as recited in claim 7.

13. A method comprising:
receiving, by a controller, a data object;
determining a format of the data object using the controller;
allocating parity bits to the data object based on the format, wherein allocating parity bits comprises allocating a first number of parity bits per unit of data to a first portion of the data object and a second number of parity bits per unit of data to a second portion of the data object, wherein the first number of parity bits per unit of data is greater than the second number of parity bits per unit of data; and
storing the data object, including the parity bits, in a storage device, wherein the first portion is stored in a first region of a storage medium of the storage device and the second portion is stored in a second region of the storage medium, and wherein the first region of the storage medium provides faster access than the second region.

14. The method as recited in claim 13, further comprising:
the controller reading the data object from the storage device;
the controller determining if any errors are present in the first portion using the parity bits allocated to the first portion;

the controller determining if any errors are present in the second portion using the parity bits allocated to the second portion; and
correcting any errors determined to be present in either of the first and second portions.

15. The method as recited in claim 13, wherein allocating parity bits to the first and second portions comprises allocating different numbers of parity bits based on unique characteristics of each of the first and second portions.

16. A system comprising:
a controller configured to:
receive a data file;
determine a file format of the data file;
determine respective characteristics of each of first and second portions of the data file; and
allocate error correction information, using an error correction code (ECC) encoder implemented in the controller, at a first rate per unit of data to the first portion and at a second rate per unit of data to the second portion, wherein the first rate is greater than the second rate; and
a storage device including a storage medium, the storage medium including a first region and a second region, wherein the first region provides faster access than the second region, and
wherein the controller is further configured to store the data file and the allocated error correction information in the storage device such that the first portion is stored in the first region and the second portion is stored in the second region.

17. The system as recited in claim 16, wherein the controller is further configured to:
read the data file from the storage device;
determine, using an ECC decoder implemented in the controller, if any errors are present in the first portion using the error correction information allocated to the first portion;
determine, using the ECC decoder, if any errors are present in the second portion using the error correction information allocated to the second portion;
correct errors, if any, found in the first and second portions; and
provide the data file to a host device.

18. The system as recited in claim 16, wherein the data file is an image data file having a plurality of layers, wherein the ECC encoder is configured to allocate error correction information at the first rate for a first subset of the plurality of layers and at the second rate for a second subset of the plurality of layers.

19. The system as recited in claim 16, wherein the data file is an image data file, wherein the ECC encoder is configured to allocate error correction information to the data file in accordance with an encoding format that defines a first group of code tables and a second group of code tables, wherein the first portion of the image data file corresponds to the first group of code tables.

20. The system as recited in claim 16, wherein the ECC encoder is configured to allocate error correction information to the second portion of the data file based at least in part on the first portion of the data file such that corruption of data in the first portion will affect an ability to decode the second portion.

21. The system as recited in claim 16, wherein the ECC encoder is configured to, based on metadata associated with the data file, determine that data in the second portion of the data file corresponds to lower priority information than data in the first portion.

22. The system as recited in claim 16, wherein the controller includes an ECC decoder having a plurality of log likelihood ratio (LLR) tables including a first LLR table corresponding to the first portion and a second LLR table corresponding to the second portion, wherein the ECC decoder is configured to, responsive to the controller receiving the data file from the storage device, determine if any errors are present in the first and second portions based in part on information in the first and second LLR tables, respectively.

23. The system as recited in claim 16, wherein the controller includes a low density parity code (LDPC) engine configured to operate in one of a plurality of different modes depending on a region of data within the data file for which a presence of errors is to be determined, wherein the LDPC engine is configured to operate in a first power mode or a second power mode dependent upon a level of importance of the region of data within the date file.

24. An apparatus comprising:
- a storage medium including a first region and a second region, wherein the first region provides faster access than the second region;
- means for allocating error correction information to first and second portions of a data object, wherein an amount of error correction information allocated per unit of data to the first portion is greater than an amount of error correction information allocated per unit of data to the second portion, wherein data of the first and second portions have different characteristics with respect to one another; and
- means for storing the data object and the error correction information allocated to the first and second portions in the storage medium such that the first portion is stored in the first region and the second portion is stored in the second region.

25. The apparatus of claim 24, wherein the means for allocating error correction information is a storage controller.

26. The apparatus of claim 24, wherein the storage medium is a magnetic or solid-state storage medium.

* * * * *